United States Patent
Park et al.

(10) Patent No.: US 8,926,114 B2
(45) Date of Patent: Jan. 6, 2015

(54) LIGHT EMITTING DEVICE PACKAGE, LIGHT SOURCE MODULE, BACKLIGHT UNIT, DISPLAY APPARATUS, TELEVISION SET, AND ILLUMINATION APPARATUS

(75) Inventors: Jung Kyu Park, Seoul (KR); Young Sam Park, Seoul (KR); Sung A Choi, Gyunggi-do (KR); Jeong Eun Lim, Hwaseong (KR); Jin Mo Kim, Gyunggi-do (KR); Man Ki Hong, Gyunggi-do (KR); Tae Heon Han, Jeju (KR); Churl Wung Shin, Gyunggi-do (KR); Young Taek Kim, Gyunggi-do (KR); Dae Woon Hong, Gyunggi-do (KR); Young Geun Jun, Gyunggi-do (KR); Jung Kyu Kook, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 214 days.

(21) Appl. No.: 13/098,698

(22) Filed: May 2, 2011

(65) Prior Publication Data

US 2011/0292302 A1 Dec. 1, 2011

(30) Foreign Application Priority Data

Apr. 30, 2010 (KR) .................. 10-2010-0040789
Dec. 24, 2010 (KR) .................. 10-2010-0134748
Feb. 24, 2011 (KR) .................. 10-2011-0016427

(51) Int. Cl.
  *G09F 13/04* (2006.01)
  *G09F 13/08* (2006.01)
  *G02B 19/00* (2006.01)
  *G02F 1/1335* (2006.01)
  *H01L 33/58* (2010.01)

(52) U.S. Cl.
  CPC ........ *G02B 19/0071* (2013.01); *G02B 19/0061* (2013.01); *G02F 1/133603* (2013.01); *G02B 19/0014* (2013.01); *H01L 2224/48091* (2013.01); *G02F 1/133606* (2013.01); *H01L 2224/48247* (2013.01); *H01L 33/58* (2013.01); *H01L 2224/8592* (2013.01); *H01L 2224/48257* (2013.01)
  USPC .......................................... 362/97.3; 362/97.1

(58) Field of Classification Search
  CPC .............. G02F 2001/133607; G02F 1/133606; G02B 5/045; G02B 6/0053
  USPC ................................................ 362/97.1–97.4
  See application file for complete search history.

(56) References Cited

U.S. PATENT DOCUMENTS

| 4,609,978 A | 9/1986 | Hsieh et al. | |
| 5,919,551 A * | 7/1999 | Cobb et al. | .................... 428/156 |

(Continued)

FOREIGN PATENT DOCUMENTS

| CN | 101644859 A | 2/2010 |
| JP | 2010-67863 A | 3/2010 |

(Continued)

OTHER PUBLICATIONS

Extended European Search Report dated Oct. 12, 2011, in counterpart European Application No. 1164369.8.

(Continued)

*Primary Examiner* — David J Makiya
(74) *Attorney, Agent, or Firm* — Sughrue Mion, PLLC

(57) ABSTRACT

A light source module, a backlight unit, a display apparatus, a television set, and an illumination apparatus are provided. The light source module includes: one or more light source units including a light emitting element emitting light when electricity is applied thereto; and an optical sheet disposed above the light source units and exhibiting bidirectional transmittance distribution function characteristics having first and second peaks at radiation angles less than 0° and greater than 0°.

25 Claims, 32 Drawing Sheets

(56) References Cited

U.S. PATENT DOCUMENTS

| | | | |
|---|---|---|---|
| 6,583,833 B1 * | 6/2003 | Kashima | 349/98 |
| 7,254,309 B1 | 8/2007 | Chou et al. | |
| 7,348,723 B2 * | 3/2008 | Yamaguchi et al. | 313/501 |
| 7,445,370 B2 | 11/2008 | Ohkawa | |
| 7,621,657 B2 * | 11/2009 | Ohkawa | 362/311.01 |
| 7,862,192 B2 * | 1/2011 | Chang | 362/97.3 |
| 8,147,100 B2 * | 4/2012 | Yamaguchi | 362/311.02 |
| 8,177,382 B2 * | 5/2012 | Roberts et al. | 362/97.4 |
| 8,251,547 B2 * | 8/2012 | Yamaguchi | 362/311.02 |
| 8,430,538 B2 * | 4/2013 | Holder et al. | 362/311.02 |
| 8,506,122 B2 * | 8/2013 | Bak et al. | 362/257 |
| 8,508,688 B2 * | 8/2013 | Iiyama et al. | 349/61 |
| 8,508,689 B2 * | 8/2013 | Kuwaharada et al. | 349/62 |
| 2005/0059766 A1 * | 3/2005 | Jones et al. | 524/431 |
| 2006/0066218 A1 * | 3/2006 | Yamaguchi et al. | 313/498 |
| 2006/0138437 A1 * | 6/2006 | Huang et al. | 257/98 |
| 2008/0007966 A1 | 1/2008 | Ohkawa | |
| 2008/0303757 A1 * | 12/2008 | Ohkawa et al. | 345/82 |
| 2009/0032827 A1 | 2/2009 | Smits | |
| 2009/0225550 A1 * | 9/2009 | Yamaguchi | 362/294 |
| 2009/0303697 A1 * | 12/2009 | Kim et al. | 362/97.2 |
| 2010/0027240 A1 | 2/2010 | Chang | |
| 2010/0046204 A1 * | 2/2010 | Shinkai et al. | 362/97.1 |
| 2010/0165660 A1 * | 7/2010 | Weber et al. | 362/609 |
| 2011/0013116 A1 * | 1/2011 | Matsuki et al. | 349/62 |

FOREIGN PATENT DOCUMENTS

| | | |
|---|---|---|
| KR | 10-2006-0039720 A | 5/2006 |
| KR | 10-0583476 B1 | 5/2006 |
| KR | 10-0888236 B1 | 3/2009 |
| KR | 10-2009-0032867 A | 4/2009 |
| KR | 10-2009-0057755 A | 6/2009 |
| KR | 10-2010-0105388 A | 9/2010 |
| TW | I253191 B | 4/2006 |
| TW | I307179 B | 3/2009 |
| TW | M364877 U | 9/2009 |

OTHER PUBLICATIONS

Communication dated Jan. 31, 2013 issued by the State Intellectual Property Office of P.R. China in counterpart Chinese Application No. 201110113187.2.

Communication dated Sep. 30, 2013, issued by the State Intellectual Property Office of the People's Republic of China in corresponding Application No. 201110113187.2.

Office Action dated Mar. 28, 2014, issued by the Taiwanese Patent Office in counterpart Taiwanese Application No. 100114809.

* cited by examiner (a) (b)

(a)

(b)

(a)

(b)

(a)

(b)

LIGHT EMITTING DEVICE PACKAGE, LIGHT SOURCE MODULE, BACKLIGHT UNIT, DISPLAY APPARATUS, TELEVISION SET, AND ILLUMINATION APPARATUS

CROSS-REFERENCE TO RELATED APPLICATIONS

This application claims priority from Korean Patent Application No. 10-2010-0040789 filed on Apr. 30, 2010 in the Korean Intellectual Property Office, Korean Patent Application No. 10-2010-0134748 filed on Dec. 24, 2010 in the Korean Intellectual Property Office, and Korean Patent Application No. 10-2011-0016427 filed on Feb. 24, 2011, in the Korean Intellectual Property Office, the disclosures of which are incorporated herein by reference in their entirety.

BACKGROUND

1. Field

Apparatuses consistent with exemplary embodiments relate to a light emitting device package, a light source module, a backlight unit, a display apparatus, a television set, and an illumination apparatus.

2. Description of the Related Art

A light emitting diode (LED), a type of semiconductor light emitting device, is a semiconductor device capable of generating light of various colors according to a recombination of electrons and holes at p and n type semiconductor junctions when current is applied thereto. Compared with a filament-based light emitting device, a semiconductor light emitting device has various advantages such as a long lifespan, low power consumption, excellent initial driving characteristics, high vibration resistance, and the like, so demand for the semiconductor light emitting device continues to grow. LEDs using group III-V compound semiconductors have been recently used. In particular, recently, group III-nitride semiconductor LEDs capable of emitting light in a short-wavelength blue light has come to prominence. A group III nitride compound semiconductor is a direct transition semiconductor, and may be stably operated at a high temperature, as compared to other semiconductors, and has therefore been widely applied to luminous elements, such as LEDs or laser diodes. Such nitride compound semiconductors are also commonly used as white light sources in various kinds of devices in various fields such as keypads, backlights, traffic lights, as well as for airport runway landing lights and spotlights, and the like.

This practical use of LEDs in various fields has brought about the importance of light source units including such LEDs. In particular, a light source unit for efficiently emitting heat generated in a light emitting element such as an LED to the outside is desirable, as a resin part or lens unit encapsulating the light emitting element may be degraded and this defect may become more serious with the use of high-power light emitting elements in a case in which the heat emitted by the light emitting element can not be efficiently discharged.

Light source modules used for an LCD backlight, or the like, conventionally employed cold cathode fluorescent lamps (CCFLs). However, CCFLs use mercury gas, having disadvantages in that it has a slow response speed and low color reproducibility (or a color gamut) and is not suitable for a light, thin, short, and small LCD panel. In comparison, LED backlights are environmentally-friendly, have a fast response speed in the range of a few nano-seconds to fit a high speed response and are thus effective for a video signal stream, are available for impulsive driving, have a color gamut of 100% or higher, can have a luminance, color temperature, or the like which are changeable by adjusting the quantity of light emitted by red, green and blue LEDs, and are suitable for a light, thin, short, and small LCD panel. As such, LEDs have been actively employed as light source modules for backlights.

However, as light emitting diodes are a point light sources, hot spots may occur from backlight modules employing LEDs, whereby it may be difficult to provide uniform illumination with respect to the emitting surface of the backlight module

SUMMARY

One or more embodiments provide a light source module having a diffusion sheet, a reduced optical distance and a reduced number of light sources, a display device having the light source module, and an illumination apparatus including the light source module.

One or more embodiments also provide a backlight unit having excellent light uniformity while having a smaller thickness.

One or more embodiments also provide a backlight unit which is thin and has excellent light uniformity by including the foregoing light source module.

According to an aspect of an exemplary embodiment, there is provided a light source module including: one or more light source units including a light emitting element emitting light when electricity is applied thereto; and an optical sheet disposed above the light source units and exhibiting bidirectional transmittance distribution function characteristics having first and second peaks at radiation angles less than 0° and greater than 0°.

The light source units may exhibit light distribution patterns having first and second peaks at the radiation angles less than 0° and greater than 0°.

The illumination angle (or orientation angle) of the light source units may be 120° or greater.

The difference between the radiation angle smaller than 0° and that greater than 0° may be 20° to 50°.

The light source units may exhibit light distribution patterns having a peak at a radiation angle of 0°.

Each of the light source units may include a lens unit disposed in a path of light emitted from the light emitting element.

The light source units may be provided in the form of a light emitting element package. The light source module may further include a circuit board on which the light emitting element is mounted, and the lens unit may be disposed to be in contact with the circuit board.

The lens unit may have such a shape that an area thereof corresponding to an upright portion of the light emitting element is relatively recessed toward the light emitting element compared with other areas of the lens unit.

The optical sheet may have a depression and protrusion structure formed on one surface thereof.

The depression and protrusion structure may be formed on the side of the optical sheet where light made incident from the light source unit is transmitted through the optical sheet.

The depression and protrusion structure may have a plurality of structures having a pyramid shape, at least some of the plurality of pyramid-shaped structures may have a plurality of sloped faces disposed to be sloped to a horizontal plane, and the plurality of sloped faces may have different tilt angles. In alternative embodiments, a polygonal cone shape may be used instead of the pyramid shape.

The sloped faces of mutually adjacent pyramid-shaped structures among the plurality of pyramid-shaped structures may have different tilt angles.

The plurality of pyramid-shaped structures may have different sizes, and based on one pyramid-shaped structure, other pyramid-shaped structures are aperiodically disposed in the vicinity of the one pyramid-shaped structure, and the aperiodical disposition structure may be periodically repeated to form the depression and protrusion structure.

At least some of the plurality of pyramid-shaped structures may have different heights.

At least some of the plurality of pyramid-shaped structures may overlap with different adjacent structures.

The depression and protrusion structure may have a plurality of conic structures.

The plurality of conic structures may be arranged in rows and columns.

The optical sheet may have a depression and protrusion structure, individual depressions and protrusions having a conical shape and both planar lateral faces and a curved lateral face.

The optical sheet may not include light diffusion particles therein.

The light source module may further include a diffusion sheet disposed in a path of light transmitted through the optical sheet after being emitted from the light source unit, and having diffusion particles dispersed in the interior of a light-transmissive base. In this case, the optical sheet may have a depression and protrusion structure formed on one surface thereof, and the depression and protrusion structure may be formed on the side of the optical sheet where light made incident from the light source unit is transmitted through the optical sheet.

The optical sheet and the diffusion sheet may be disposed to be spaced apart, or the diffusion sheet may be disposed to be stacked on the optical sheet.

A plurality of light source units may be arranged on the circuit board, and the distance between the circuit board and the diffusion speed may be smaller than or equal to a half of the pitch between the plurality of light source units.

According to an aspect of another exemplary embodiment, there is provided a backlight unit including: one or more light source units including a light emitting element emitting light when electricity is applied thereto; an optical sheet disposed above the light source units and exhibiting bidirectional transmittance distribution function characteristics having first and second peaks at radiation angles less than 0° and greater than 0°; and a diffusion sheet disposed in the path of light transmitted through the optical sheet after having been emitted from the light source units, and having diffusion particles dispersed in a light-transmissive base.

The backlight unit may further include: a luminance enhancement sheet disposed in the path of light transmitted through the diffusion sheet.

According to an aspect of another exemplary embodiment, there is provided a display apparatus including: one or more light source units including a light emitting element emitting light when electricity is applied thereto; an optical sheet disposed above the light source units and exhibiting bidirectional transmittance distribution function characteristics having first and second peaks at radiation angles less than 0° and greater than 0°; a diffusion sheet disposed in the path of light transmitted through the optical sheet after having been emitted from the light source units, and having diffusion particles dispersed in a light-transmissive base; and a display panel disposed at an upper portion of the diffusion sheet.

According to n aspect of another exemplary embodiment, there is provided a television set including the foregoing display apparatus.

According to an aspect of another exemplary embodiment, there is provided an illumination apparatus including: one or more light source units including a light emitting element emitting light when electricity is applied thereto; an optical sheet disposed above the light source units and exhibiting bidirectional transmittance distribution function characteristics having first and second peaks at radiation angles less than 0° and greater than 0°; a housing disposed to surround the light source units and the optical sheet; and a socket structure electrically connected to the light source units.

BRIEF DESCRIPTION OF THE DRAWINGS

The above and/or other aspects, features and advantages will be more clearly understood from the following detailed description taken in conjunction with the accompanying drawings, in which.

DETAILED DESCRIPTION

Figure 1:
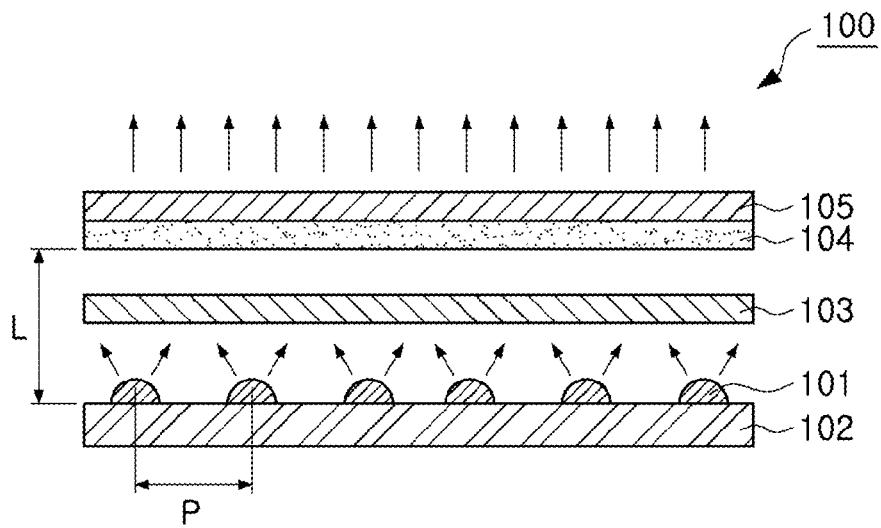
FIG. 1 is a cross-sectional view schematically showing a light source module according to an exemplary embodiment.

Exemplary embodiments will now be described in detail with reference to the accompanying drawings. The invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference numerals will be used throughout to designate the same or like components.

With reference to FIG. 1, a light source module 100 includes a light source unit 101 and an optical sheet 103, and further includes a circuit board 102 on which the light source unit 101 is mounted, and a diffusion sheet 104 and a luminance enhancement sheet 105 disposed at an upper side of the optical sheet 103.

Figure 2:
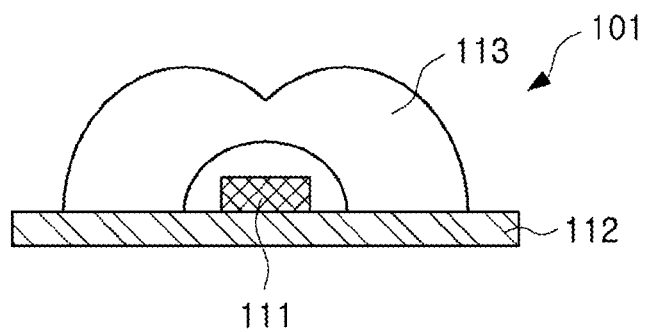
FIG. 2 is a cross-sectional view of an exemplary light source unit of FIG. 1.

As shown in FIG. 2, the light source unit 101 may include a light emitting element 111 which emits light when an electrical signal is applied thereto, and the light source module 100 may include one or more light source units 101 (a plurality of light source units in the present exemplary embodiment). In this case, a lens unit 113 may be disposed on a path of light emitted from the light emitting element 111. In addition, the light source unit 101 may include a package substrate 112 electrically connected to the light emitting element 111. The package substrate 112 may be, for example, a printed circuit board (PCB), a metal core PCB (MCPCB), an a metal PCB (MPCB), a flexible PCB (FPCB), or the like, or a lead frame. The light emitting element 111 may be any element so long as it emits light when an electrical signal is applied thereto. An LED may be used as the light emitting element 111. An LED in which a semiconductor layer is epitaxially grown on a growth substrate may be used. The growth substrate may be made of sapphire; however, it is not limited thereto. The growth substrate may be made of a substrate material such as spinel, silicon carbide (SiC), gallium nitride (GaN), gallium arsenide (GaAs) or the like, as would be understood by one of skill in the art. In particular, the LED may be made of BN, SiC, ZnSe, GaN, InGaN, InAlGaN, AlGaN, BAlGaN, BInAlGaN or the like, and may be doped with Si, Zn or the like. In addition, a light emitting layer of the LED may be made of a nitride semiconductor formed of $In_xAl_yGa_{1-x-y}(0 \leq X \leq 1, 0 \leq Y \leq 1, X+Y \leq 1)$, and may have a single or multiple quantum well structure, whereby the output thereof may be improved.

The example illustrated in FIG. 2 has a structure in which the light source unit 101 includes one light emitting element 111, but the light source unit 101 may include a plurality of light emitting elements. For example, one light source unit 101 may include light emitting elements respectively emitting red (R), green (G), and blue (B) light. Accordingly, white light having excellent mixture characteristics of three-color light can be obtained by using a light source unit 101 including R, G, and B light emitting elements and an optical sheet 103 described herein. Of course, light emitted from the plurality of light source units 101 provided in the light source module may also have different respective colors.

The lens unit 113 may have a wavelength conversion material (e.g., a phosphor, quantum dots, or the like) dispersed therein in order to convert light emitted from the light emitting element 111 into a different color. For example, the light emitting element 111 may emit blue light and the wavelength conversion material may include at least one of green, yellow, and red phosphors. Alternately, the wavelength conversion material may be applied to a different position, rather than to the lens unit 113. For example, the wavelength conversion material may be coated on the surface of the light emitting element 111 or may be disposed at a position spaced apart from the light emitting element 111 at a package level. In addition, the wavelength conversion material may be applied to the surface or the interior of the optical sheet 103 (to be described).

Figure 3:
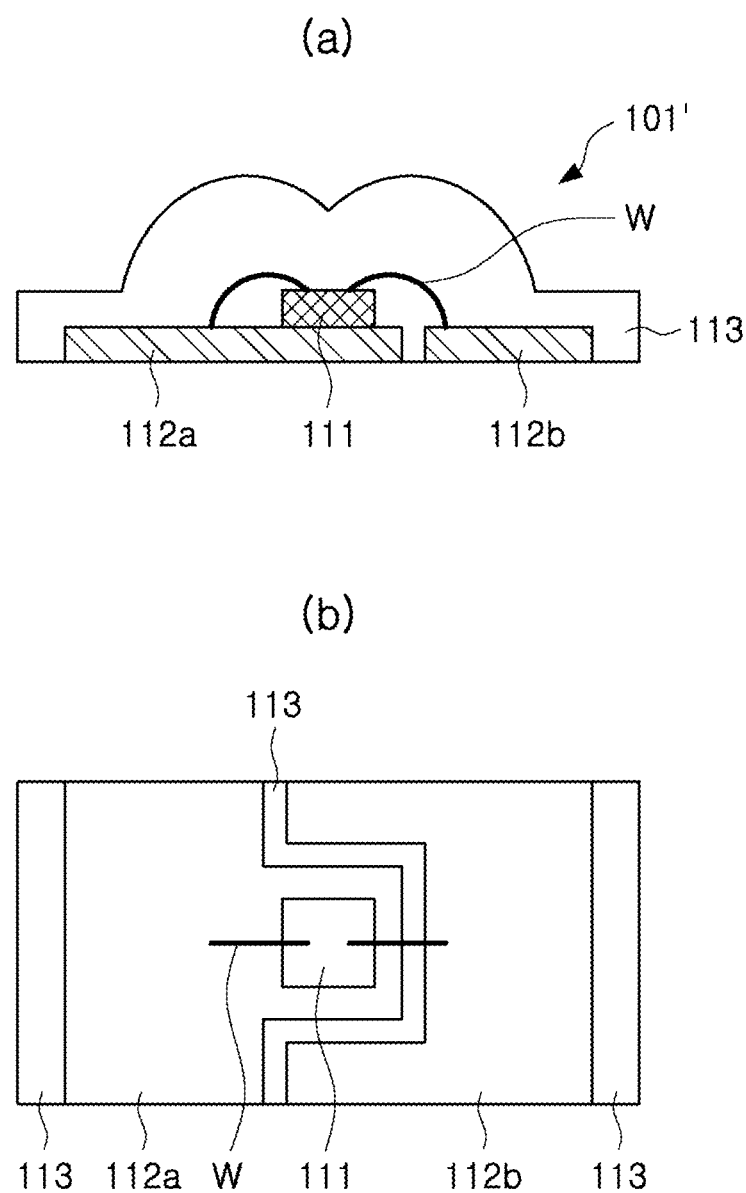
FIG. 3(a) is a cross-sectional view of another exemplary light source unit.
FIG. 3(b) is a top plan view of the light source unit of FIG. 3(a)

As shown in FIG. 2 the light source units 101 may be disposed on the flat package substrate 112. Alternately, the light emitting element 111 may be disposed in a package main body having a reflective cup-like shape. The light emitting element 111 may be modified to have various other structures so long as it has a light distribution pattern intended in the present exemplary embodiment. For example, in a light source unit 101', as illustrated in FIG. 3(a), the light emitting element 111 may be disposed on at least one of first and second lead frames 112a and 112b and electrically connected by wires W to the first and second lead frames 112a and 112b. One conductive wire W may be used, or another means for electrically connecting the light emitting element to the first and second lead frames may be used, according to the configuration of the light emitting element 111. For example, when electrodes of the light emitting element 111 are formed on upper and lower surfaces of a light emission structure interposed therebetween, only one conductive wire W may be used, and when the light emitting element 111 is disposed in the form of a flip chip on two lead frames 112a and 112b, the conductive wire W may not be used.

As shown in FIGS. 3(a) and 3(b), lower surfaces of the first and second lead frames 112a and 112b may be exposed to be provided as an electricity connection part, and with this structure, a heat releasing effect can be provided. In this case, as shown in the top plan view of FIG. 3(b), the first lead frame 112a may have a portion thereof which protrudes toward the second lead frame 112b and the second lead frame 112b may have a corresponding recessed portion to receive the protruding portion of the first lead frame 112a. This structure may provide an improved coupling force between the lead frames and the lens unit 113. The lens unit 113 may be made of a light-transmissive resin and may be combined with the first and second lead frames 112a and 112b to support the first and second lead frames 112a and 112b. Although not shown, the first and second lead frames 112a and 112b may include one or more holes or step structures, or a combination thereof in order to increase a contact area with the lens unit 113. Examples of holes and step structures are described below with respect to FIGS. 41-45.

Figure 5:
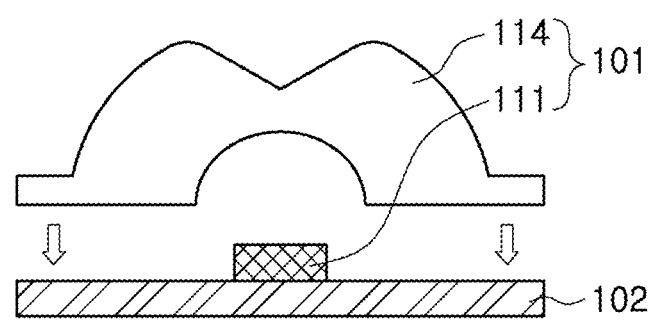
FIG. 5 is a cross-sectional view of another exemplary light source unit.

Additional exemplary package structures which may be used for a light source unit are described below with respect to FIGS. 24-45. However, the light source unit 101 may be provided in a different form, rather than a package form. Namely, the light source unit 101 may have a chip-on-board (COB) structure as shown in FIG. 5 in which the light emitting element 111 is directly mounted on the circuit board 102 and the lens unit 114 may be disposed on the circuit board 102 so as to be in contact with the circuit board. Meanwhile, the circuit board 102 illustrated in FIG. 1 provides a mounting area for the light source unit 101. For example, a PCB, an MCPCB, an MPCB, an FPCB, or the like, used in the art may be employed as the circuit board 102. In this case, the circuit board 102 may have a wiring pattern (not shown) disposed on a surface or in the interior thereof, and the wiring pattern may be electrically connected to the light source unit 101.

Figure 4:
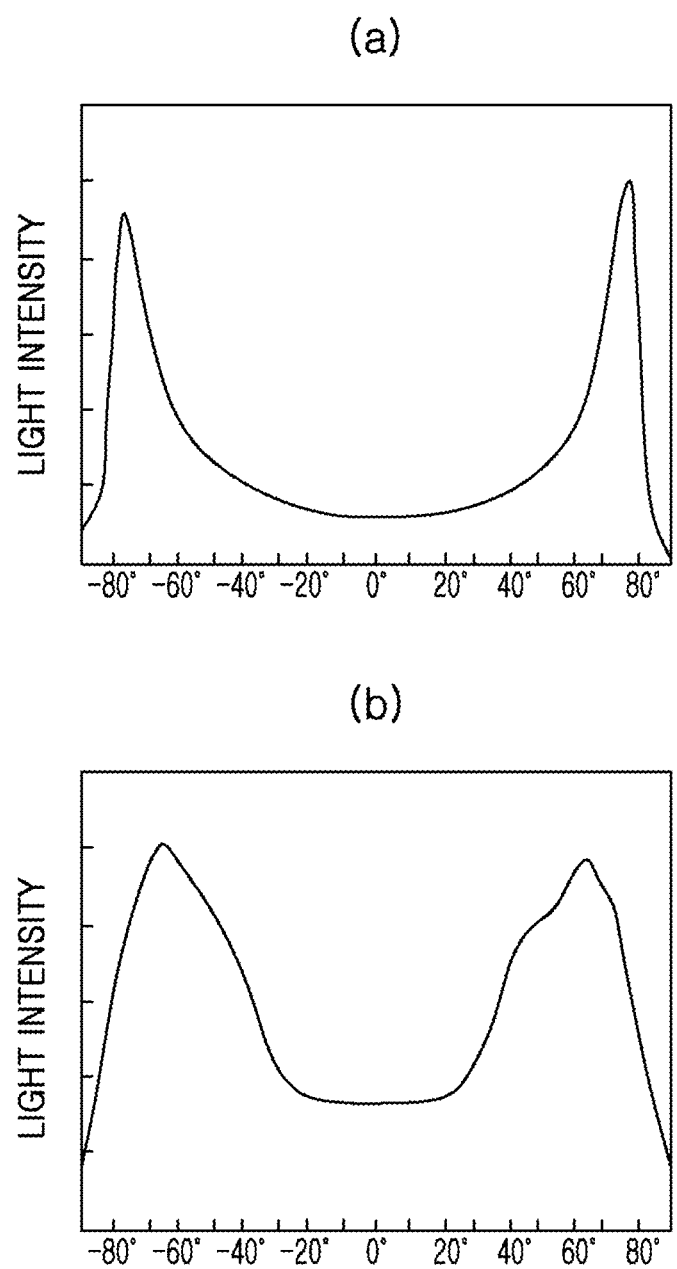
FIGS. 4(a) and 4(b) are graphs showing examples of light distribution pattern of the light source unit of FIG. 1, in which a horizontal axis is a radiation angle and the light intensity of a vertical axis indicates relative values.

In the present exemplary embodiment, the light source unit 101 has a light distribution pattern as shown in FIG. 4. In detail, the light source unit 101 may have a light distribution pattern having first and second peaks at radiation angles less than 0° and greater than 0°, rather than at an upright portion, i.e., at the angle of 0°. For example, as shown in FIGS. 4(a) and 4(b), the light distribution pattern of the light source unit 101 may have a total of two peaks, namely, one peak at a radiation angle smaller than 0° and one peak at a radiation angle greater than 0°. In FIG. 4, a pattern without a peak at a radiation angle of 0° is illustrated, but according to the structure of the light source unit 101, a local peak may also be generated at the radiation angle of 0°, and in this case, the peak at the radiation angle of 0° may have a size smaller than that of the first and second peaks. The light source unit 101 having such a light distribution pattern has a light intensity (or illumination) greater at the peripheral (or marginal) portions than at the upright portion (i.e., at the radiation angle of 0°), and may have a relatively large orientation angle value (120° or greater). These optical characteristics of the light source unit 101, namely, that light spreads to the marginal portions of the upright portion, rather than being concentrated in the upright portion of the light source unit 101, are advantageous for a light mixture with a different light source unit 101 in the upper area of the light source unit 101, and in particular, the light mixture effect can be further improved when the light source unit 101 is combined with the optical sheet 103 having the optical characteristics proposed in the present exemplary embodiment (to be described). In order to allow the light source unit 101 to have the light distribution pattern illustrated in FIGS. 4(a) and 4(b), as shown in FIGS. 2, 3, 5, 24, and 25, the lens units 113 may have a shape in which an area corresponding to the area directly above the light emitting element 111 is recessed toward the light emitting element 111, as compared with other areas, thereby inducing light to be irradiated to the peripheral areas, rather than the area directly above the light emitting element, thus providing a greater orientation angle. The shape of the lens units illustrated in FIGS. 2, 3, 5, 24, and 25 are merely illustrative, and the shapes of a light source unit and a lens unit having the light distribution pattern similar to that of FIGS. 4(a) and 4(b) may be variably modified. For example, the lens unit may have a hemispherical shape, and diffusion particles or a reflective part having an appropriate shape may be applied to a surface or the interior of the lens unit to obtain similar optical characteristics.

Figure 6:
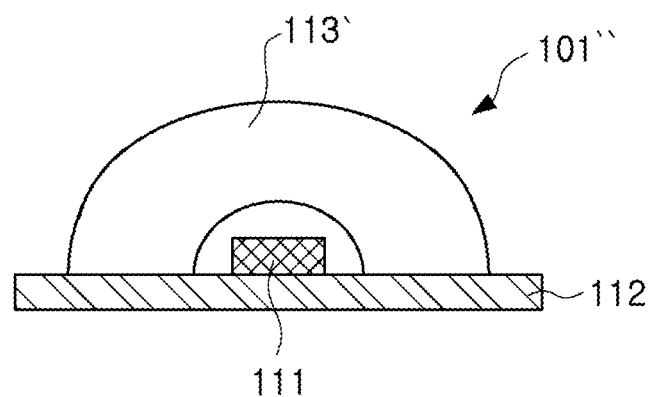
FIG. 6 is a cross-sectional view showing another example of the light source unit of FIG. 1.
Figure 7:
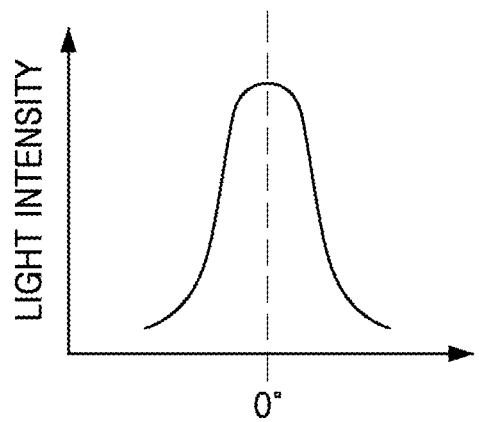
FIG. 7 is a graph showing another example of a light distribution pattern of the light source unit of FIG. 1.

In the case of the light source unit, as an alternative to the the described structure having the radiation angles less than 0° and greater than 0°, a structure having a peak at the radiation angle of 0° at which light intensity is the strongest (a so called Gaussian pattern), as shown in FIG. 7, may be also used. A light source unit 101" in FIG. 6 is an example of a structure with such a light distribution pattern, which includes a hemispherical lens unit 113' covering the light emitting element 111. The shapes of the lens units of the light source unit of FIGS. 3 and 5 may also be changed to be similar to that of the lens unit 13' of FIG. 6. When the light source unit has the light distribution pattern as shown in FIG. 7, namely, when light intensity is strongest at the upright portion of the light source unit 101", the optical sheet 103 having a function of inducing light, which has been made incident in a vertical direction, to a lateral direction may be disposed above the light source unit 101" to obtain a high level of light mixture effect.

Figure 8:
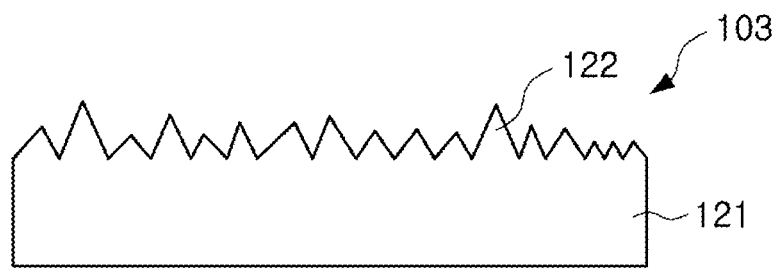
FIG. 8 is a cross-sectional view schematically showing an example of an optical sheet which may be employed in the light source module of FIG. 1.
Figure 9:
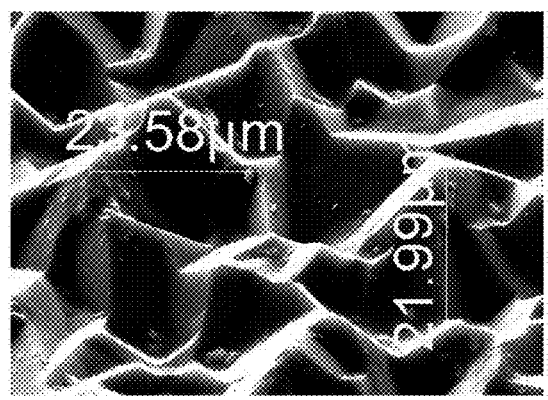
FIG. 9 is a photographic image obtained by capturing a surface of an exemplary optical sheet.
Figure 10:
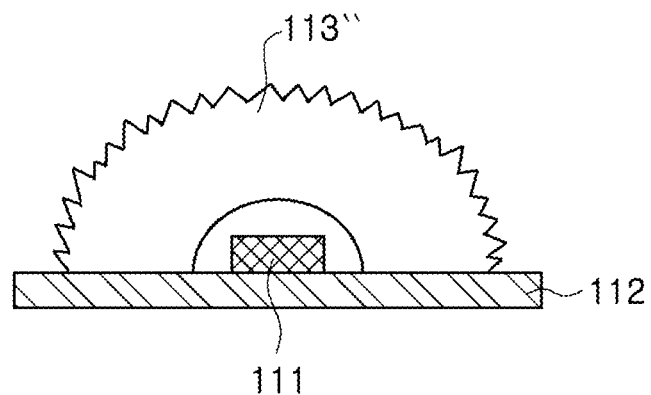
FIG. 10 is a cross-sectional view of another exemplary light source unit.
Figure 11:
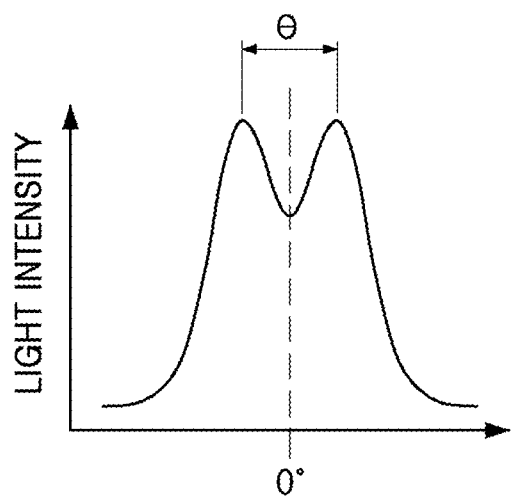
FIG. 11 is a graph showing an example of a bidirectional transmittance distribution function (BTDF) of an optical sheet.

The optical sheet 103 disposed on the path of light emitted from the light source unit 101 (in this embodiment, the optical sheet 103 is disposed above the light source unit) has similar light distribution characteristics to those of the light source unit 101 illustrated in FIG. 4. This will now be described with reference to FIGS. 8 to 16. FIG. 8 is a cross-sectional view schematically showing an example of an optical sheet which may be employed in the light source module of FIG. 1. FIG. 9 is an image of a photograph obtained by capturing a surface of the optical sheet of FIG. 8. FIG. 11 is a graph showing an example of a bidirectional transmittance distribution function (BTDF) of the optical sheet. In this case, the BTDF of the optical sheet can be obtained by measuring radiation patterns made by a laser beam made incident in a direction perpendicular to the optical sheet, according to radiation angles.

With reference to FIG. 11, the BTDF characteristics of the optical sheet 103 have first and second peaks at radiation angles less than 0° and greater than 0°. In detail, the BTDF characteristics have one peak at a radiation angle smaller than 0 and one peak at a radiation angle greater than 0°. In this case, the difference θ between the radiation angle smaller than 0° and the radiation angle greater than 0° may range from 20° to 50°. When the optical sheet 103 having such light-transmissive characteristics is combined with the light source units 101, 101' and 101" having the foregoing light distribution patterns, light uniformity at the upper portion of the optical sheet 103 can be further improved (to be described later). Also, although not shown, a wavelength conversion material (e.g., at least one of yellow, green, and red wavelength conversion materials) such as a phosphor or a quantum dot may be applied to the surface or the interior of the optical sheet 103 to convert light (e.g., blue light) emitted from the light source unit 101, and accordingly, the light source module 100 can obtain light of an intended color, e.g., white light having high color rendering properties.

The optical sheet 103 may be employed to have various structures exhibiting the foregoing light-transmissive characteristics. For example, as shown in FIG. 8, the optical sheet 103 may have a depression and protrusion structure 122 formed on one surface thereof. In detail, the optical sheet 103 includes a light-transmissive base 121 and the depression and protrusion structure 122 extending from the light-transmissive base 121. In this case, the depression and protrusion structure 122 is formed at the side where light made incident from the light source unit 101 is emitted from the optical sheet 103. Namely, the light source unit 101 may be disposed at a lower side of the light-transmissive base 121 as shown in FIG. 8. The light-transmissive base 121 may have a thickness ranging from about 0.5 mm to about 1.5 mm and may be made of a material commonly used to fabricate an optical element in the art, such as poly methyl methacrylate (PMMA), or the like. The depression and protrusion structure 122 may have a thickness of tens of micrometers (μm) and may be made of the same material as that of the light-transmissive base 121. The depression and protrusion structure 122 may also be formed by applying a UV-setting or thermosetting material to the light-transmissive base 121, transferring depressions and protrusions thereto, and performing a curing process thereon. In this case, the optical sheet 103 may not necessarily have the depression and protrusion structure 122 but may have any optical structures (e.g., a diffusion structure, a reflective structure, or the like) other than the depression and protrusion structure 122, so long as it can exhibit the BTDF characteristics of FIG. 10. Also, as shown in FIG. 10, a depression and protrusion structure having a shape, which is the same as or similar to the depression and protrusion structure 122 of FIG. 8, may be applied to the surface of the lens 113", and in this case, the light source module may not include the optical sheet 103.

The shape of the depression and protrusion structure 122 may be appropriately adjusted to allow the BTDF of the optical sheet 103 to exhibit the characteristics as shown in FIG. 11, and the depression and protrusion structure 122 may have a conical shape so as to appropriately spread light, which has been made incident in a vertical direction, to all vicinities thereof. In this case, the depression and protrusion structure is not necessarily limited to the conical shape and a depression and protrusion structure having any other shape can be employed so long as it can exhibit desired BTDF characteristics, such as those illustrated in FIG. 11. When the depression and protrusion structure has a conical shape, the path of light, which has been made incident in a vertical direction, may be changed by the sloped lateral side of the conic structure so as to spread in a lateral direction. The depression and protrusion structure may have pyramid-shaped structures. The pyramid-shaped structures may have bases which are triangles, quadrilaterals, or other polygons. Here, besides a pyramid or a circular cone, the structures may include complex forms thereof; namely, the conic or pyramid structure may include both a planar lateral face and a curved lateral face. For example, as shown in FIGS. 8 and 9, the depression and protrusion structure 122 may have a plurality of structures having a pyramid shape, and at least some of the plurality of pyramid structures have a plurality of sloped faces disposed to be sloped to an upper or lower surface of the light-transmissive base 121. In detail, as shown in FIGS. 8 and 9, two or more sloped faces of the at least some of the plurality of pyramid-shaped structures may have different tilt angles, and in addition, sloped faces of mutually adjacent pyramid-shaped structures may also have different tilt angles. Also, as shown in FIG. 9, at least some of the plurality of pyramid-shaped structures may have different sizes and heights. Based on one pyramid-shaped structure, the other pyramid-shaped structures may be aperiodically disposed in the vicinity of the one prism structure. In this case, in an example of a method for completing the optical sheet 103, such an aperiodical disposition structure may be periodically repeated. Also, as shown in FIG. 9, at least some of the plurality of pyramid-shaped structures may overlap with other adjacent structures.

Figure 17:
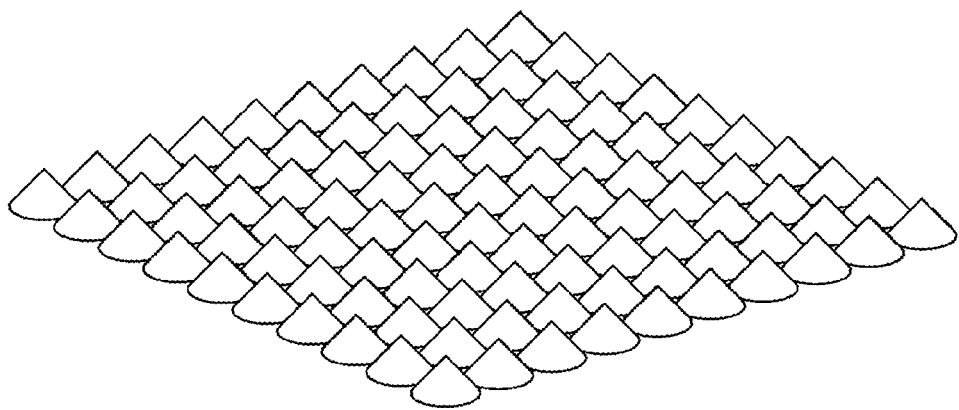
FIG. 17 is a perspective view schematically showing another example of an optical sheet.

As shown in the optical sheet 103' according to a modification of an exemplary embodiment as illustrated in FIG. 17, the optical sheet 103' may have other structures, e.g., conic structures, in order to provide the foregoing optical characteristics, to change the path of light, which has been made incident in a vertical direction, and to induce the light to move in a lateral direction. In this case, a plurality of circular conical structures may be provided and arranged in rows and columns.

In order for light to appropriately spread in the lateral direction by virtue of the conical structures, the optical sheet 103 may have a high level of transparency. Therefore, the optical sheet 103 may not include light diffusion particles. When the optical sheet 103 does not include light diffusion particles, a loss of light which would be caused by the light diffusion particles can be minimized to improve the luminous efficiency of the light source module 100 using the optical sheet 103. However, this does not mean that the optical sheet 103 must not include any light diffusion particles therein, but light diffusion particles may be unavoidably present due to the process of fabricating the optical sheet 103 or a very small amount of light diffusion particles may be purposefully dispersed in the interior of the optical sheet 103.

As described above, in having the structure in which the polygonal cone-shaped structures are aperiodically disposed, the optical sheet 103 can exhibit the foregoing BTDF characteristics of FIG. 11, and these will now be described with reference to FIGS. 12, 13 and 14.

Figure 12:
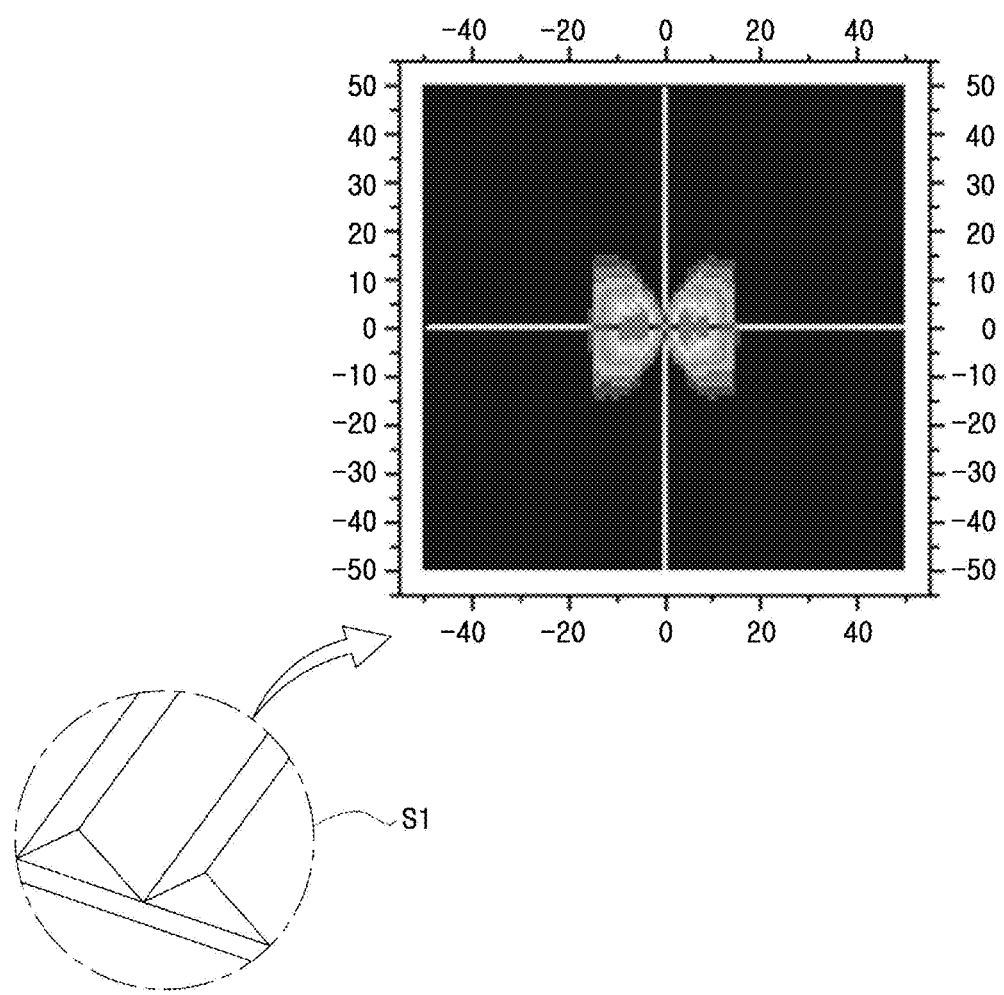
FIGS. 12 and 13 show light emission distributions which can be obtained from optical sheets according to comparative examples.
Figure 13:
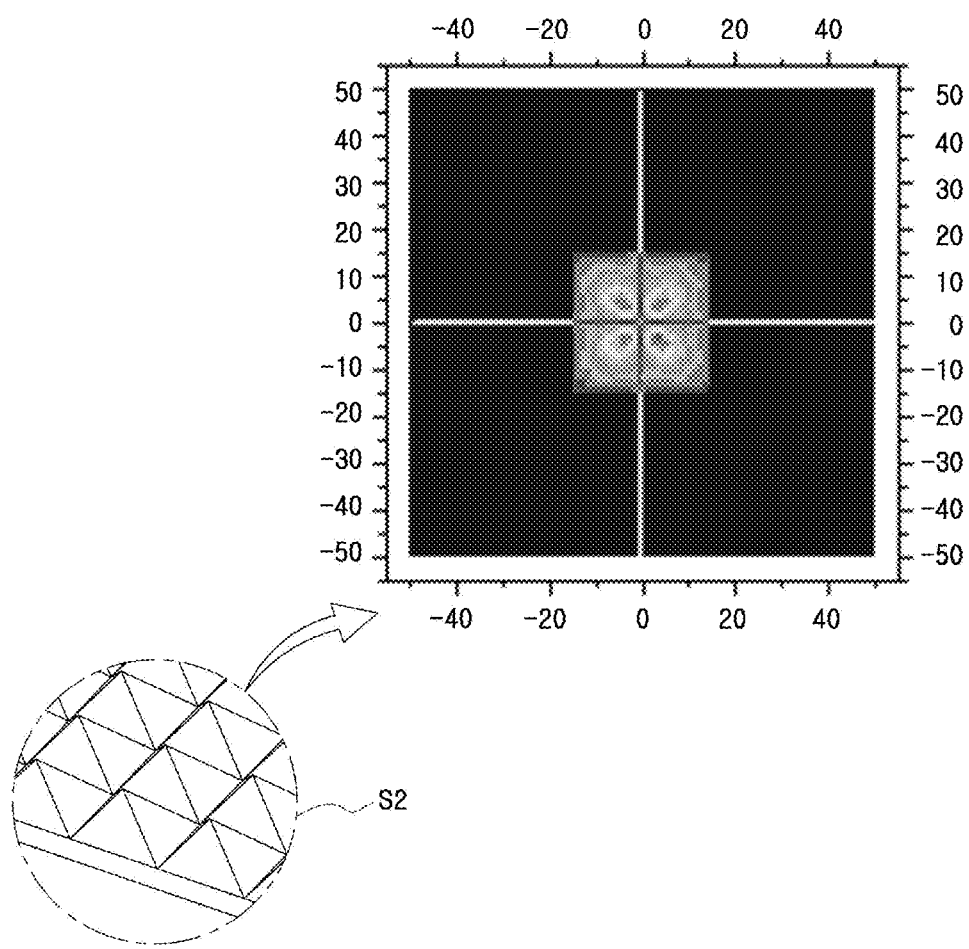
Figure 14:
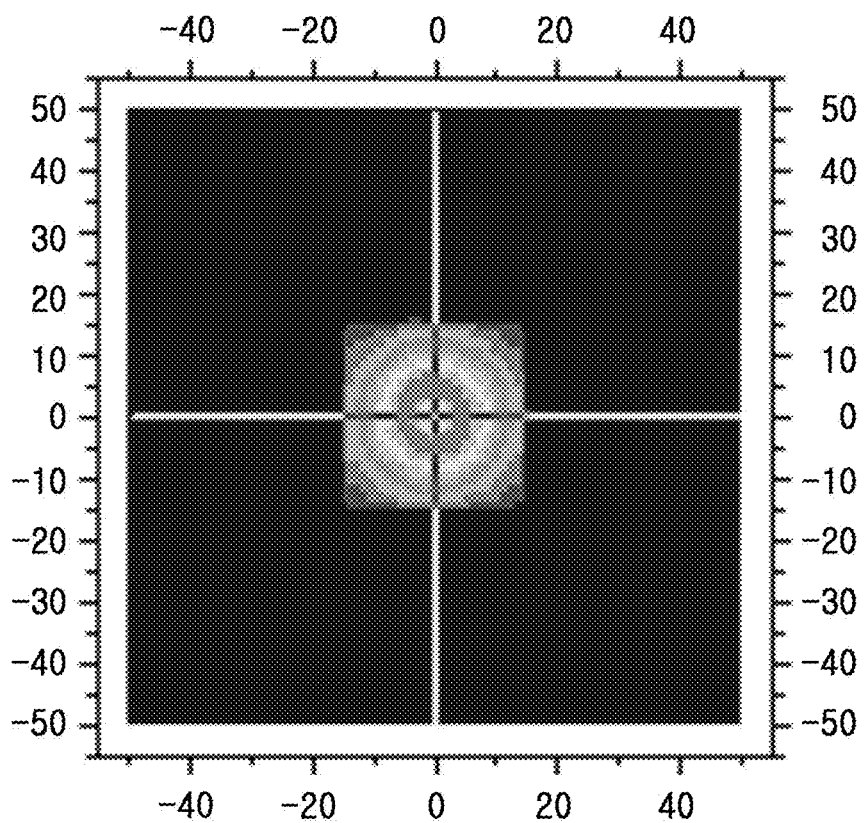
FIG. 14 shows a light emission distribution obtained from an optical sheet having the BTDF of FIG. 11.

FIGS. 12 and 13 show light emission distributions which can be obtained from optical sheets according to comparative examples. Specifically, the light emission distributions are obtained by measuring light intensity (or illumination) after irradiating light to a lower side of the light source unit having the light distribution pattern of FIG. 4. FIG. 14 shows a light emission distribution which can be obtained from an optical sheet having the BTDF of FIG. 11. Similarly, the light emission distribution is obtained by irradiating light to a lower side of the light source unit.

The optical sheet of FIG. 12 has a pattern S1 in which trigonal prisms having a stripe shape are arranged in one direction, exhibiting a light emission distribution in which light is spread only left and right (as shown in FIG. 12) by two sloped faces of the trigonal prisms. The optical sheet of FIG. 13 has a pattern S2 in which quadrangular pyramids are regularly arranged in rows and columns, exhibiting a light emission distribution in which light is spread only up, down, left, and right (as shown in FIG. 13) by the four sloped faces of the quadrangular pyramids. In this manner, when the optical sheets of FIGS. 12 and 13 are used, the light emission distributions have particular directionalities, rather than having the BTDF characteristics as described above with reference to FIG. 11. In comparison, as shown in a light emission distribution of FIG. 14, when an optical sheet according to exemplary embodiments described herein is used, the light emission distribution does not have directionality but the same light emission characteristics are obtained substantially in every direction.

Figure 15:
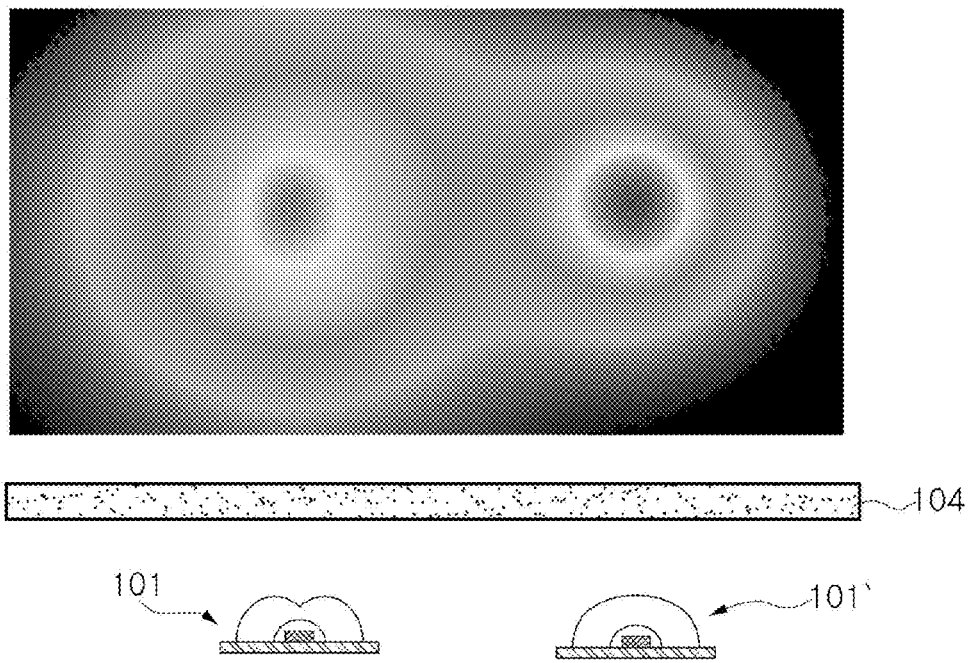
FIGS. 15 and 16 show light emission distributions according to a comparative example and an exemplary embodiment.
Figure 16:
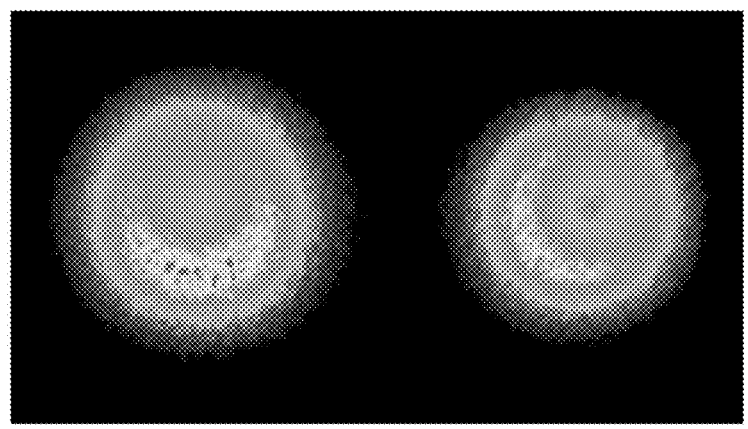
Figure 16:
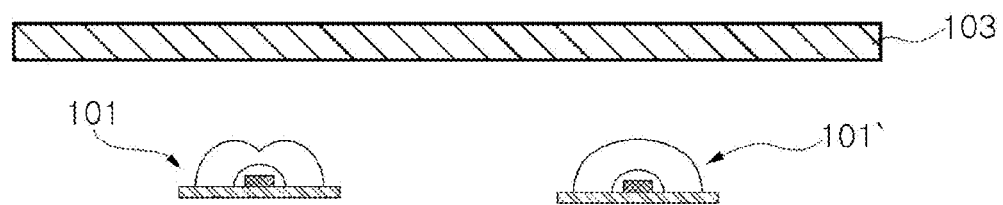

The results obtained by comparing the effects of an optical sheet as proposed herein in a different aspect will now be described with reference to FIGS. 15 and 16. FIGS. 15 and 16 show light emission distributions according to a comparative example and according to an exemplary embodiment. First, in case of FIG. 15, light emission distributions were measured by disposing the diffusion sheet 104 at an upper side of different light source units 101 and 101' having different light distribution patterns, and in this case, the diffusion sheet 104 has a structure in which diffusion particles are dispersed in a light-transmissive base (to be described). In this case, the light source units 101 and 101' have the structure as described above with reference to FIGS. 2 and 6. In case of FIG. 16, light emission distributions were measured by replacing the diffusion sheet 104 of the comparative example of FIG. 15 with an optical sheet 103.

First, with reference to FIG. 15, in case of the comparative example, it is noted that light intensity is relatively great in the regions where the light source units 101 and 101' are located, which means that the effect that light, which has been made incident in a direction perpendicular to the diffusion sheet 104, spreads in the lateral direction is not great. In comparison, as noted in the light emission distribution of FIG. 16, when the optical sheet 103 proposed in an exemplary embodiment is disposed above the light source units 101 and 101', the area of light emission is reduced but the light intensity is more uniform overall, which means that light has been spread sufficiently in the lateral direction by the optical sheet 103 having the conic structures. In particular, with reference to FIG. 16, it can be noted that such an effect can be obtained with respect to both the light source unit 101 having first and second peaks at the radiation angles less than 0° and greater than 0° and the light source unit 101 having the peak at the radiation angle of 0°. Meanwhile, as described above, when the optical sheet 103 is in use, the overall light emission area may be small; however, the light emission area can be increased by adjusting the distance between the optical sheet 103 and the light source units 101 and 101', or by disposing the diffusion sheet 104 at an upper side of the optical sheet 103 as shown in the structure illustrated in FIG. 1.

Figure 18:
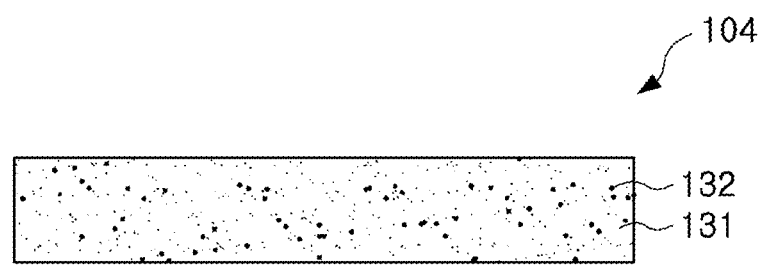
FIG. 18 is a cross-sectional view showing an example of a diffusion sheet which may be employed in the light source module of FIG. 1.

The diffusion sheet 104, disposed on a light emission side of the optical sheet 103 (the diffusion sheet 104 may be disposed at an upper side of the optical sheet 103), is similar to the optical sheet 103 in a functional aspect, in that it changes the paths of light made incident from a plurality of paths and mixes them, but an internal structure of the diffusion sheet 104 is different from that of the optical sheet 103. Namely, as shown in FIG. 18, the diffusion sheet 104 may include a light-transmissive base 131 and diffusion particles 132 dispersed in the light-transmissive base 131. The diffusion particles 132 may be made of a material such as $TiO_2$, $SiO_2$, or the like. The term 'diffusion sheet' is used, but this generally refers to an optical structure which performs a diffusion function and has a planar shape, and an optical element such as a 'diffusion plate' whose shape is not deformed although there is no other structure supporting the diffusion plate may be included. A luminance enhancement sheet 105 disposed on a light emission side of the diffusion sheet 104 (the luminance enhancement sheet 105 may be disposed on an upper side of the diffusion sheet 104) serves to direct light in an upward direction in order to provide light to a liquid crystal panel, or the like. For example, the luminance enhancement sheet 105 may have a plurality of pyramid-shaped structures formed thereon. In this case, for example, a dual brightness enhancement film (DBEF), a brightness enhancement film (BEF), or the like, may be used as the luminance enhancement sheet 105.

Figure 19:
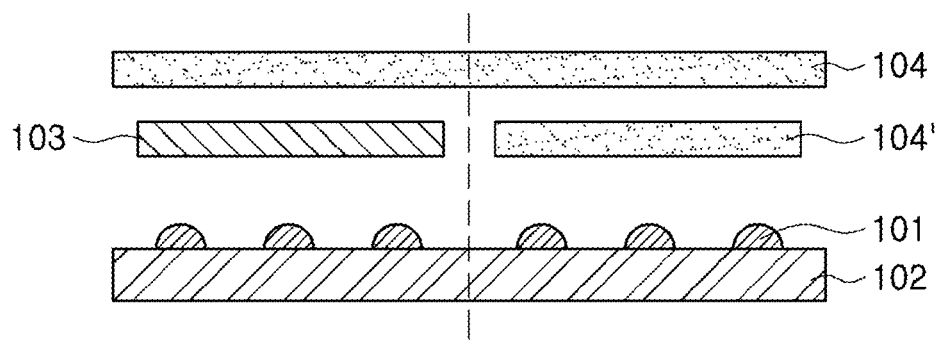
FIG. 19 is a cross-sectional view schematically showing a configuration of a light source module according to an exemplary embodiment and according to a comparative example.

A light mixture effect according to the configuration of the light source module 100, namely, the structure using both the optical sheet 103 and the diffusion sheet 104, proposed in the present exemplary embodiment as described above will now be described. FIG. 19 is a cross-sectional view schematically showing the configuration of a light source module according to an exemplary embodiment and that of comparative example. In FIG. 19, based on the dotted line, the left side corresponds to the light source module of FIG. 1 and the right side corresponds to the structure in which a diffusion sheet 104' is employed, instead of the optical sheet 103 in the light source module of FIG. 1. In this case, the light source unit 101 has the light distribution pattern illustrated in FIG. 4, and the diffusion sheet 104' has a structure in which diffusion particles are dispersed in a light-transmissive base, similar to the structure illustrated in FIG. 18.

Figure 20:
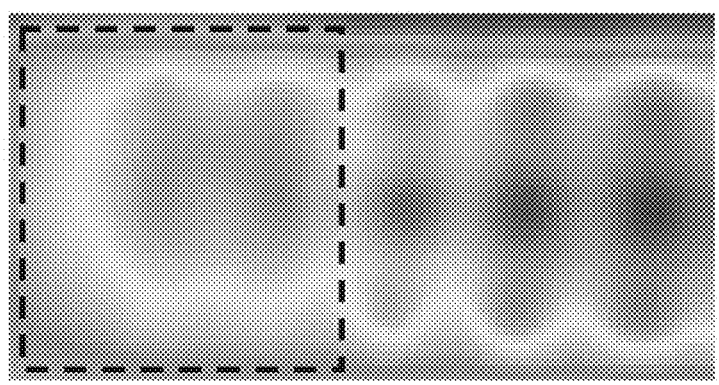
FIG. 20 is a view showing a light emission distribution at an upper portion of the light source module of FIG. 19.

FIG. 20 is a view showing a light emission distribution at an upper portion of the light source module of FIG. 19. In FIG. 20, the area indicated by the dotted line corresponds to the left structure, namely, the structure using the optical sheet 103 and the diffusion sheet 104 in FIG. 19. As shown in FIG. 20, relatively excellent light mixture characteristics can be obtained with the structure in which the optical sheet 103 and the diffusion sheet 104 are combined. Namely, the light mixture characteristics are superior when the optical sheet 103 and the diffusion sheet 104 are combined, compared with the case in which two diffusion sheets 104 and 104' are employed, due to the fact that at least a portion of light made incident in the vertical direction is appropriately blocked by the optical sheet 103. Also, such a light mixture characteristics enhancement effect can be more remarkable when the light source unit 101 having the light distribution pattern of FIG. 4, rather than the Gaussian light distribution pattern, is used. When the light mixture effect is improved, the optical distance L (in FIG. 1) corresponding to the position at which the diffusion sheet is disposed can be reduced and the pitch P between the light source units 101 can be increased simultaneously or independently, and thus, the number of the light source units 101 can be reduced.

In detail, with reference to FIG. 1, the distance L between the circuit board 102 and the diffusion sheet 104 may be smaller than or equal to a half of the pitch P between the light source units 101, which is very effective level as compared with the case in which L/P is approximately 1 when the light source unit having the Gaussian light distribution pattern is used. Thus, although the optical distance or the number of the light source units is reduced, excellent light uniformity can be obtained. Thus, when the light source module is used as a backlight unit, display apparatus images, such as those of an LCD, or the like, can become sharper and clearer, and in addition, the thickness of a television set, the number of light sources, power consumption, and the like, having such a display apparatus can be reduced. In addition, the light source module can be also used for an illumination device, as well as for a backlight unit, a display apparatus, a television set, and also in this case, the thickness and number of the light sources can be reduced. Namely, a housing, a socket structure, or the like, may be coupled to the periphery of the light source module having the foregoing structure and a lens having a hemispherical shape may be disposed on a light emission path of the light source module so as to be used as an illumination apparatus.

Figure 21:
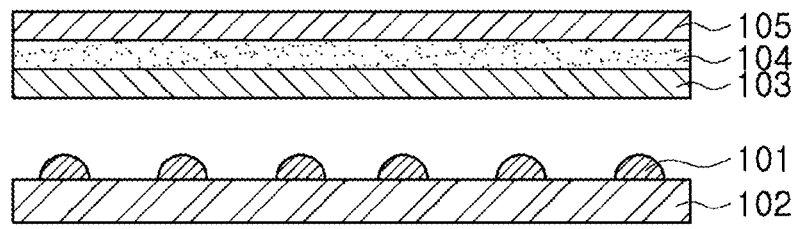
FIGS. 21, 22, and 23 are cross-sectional views schematically showing light source modules according to exemplary embodiments.

Meanwhile, the light source module having the foregoing structure can be variably modified so long as the optical characteristics of the light source unit 101 and the optical sheet 103 are maintained, examples of which will now be described with reference to FIGS. 21, 22 and 23. In case of a light source module as shown in FIG. 21, its structure is similar to that of the light source module of FIG. 1, except that the diffusion sheet 104 is attached to the optical sheet 103, namely, the diffusion sheet 104 is stacked on the optical sheet 103, unlike a light source module in which the diffusion sheet 104 and the optical sheet 103 are separated. With this structure, the optical distance can be reduced, so the light source module can have a compact structure.

Figure 22:
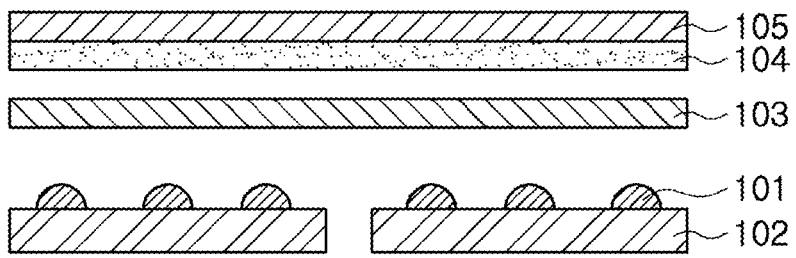
Figure 23:
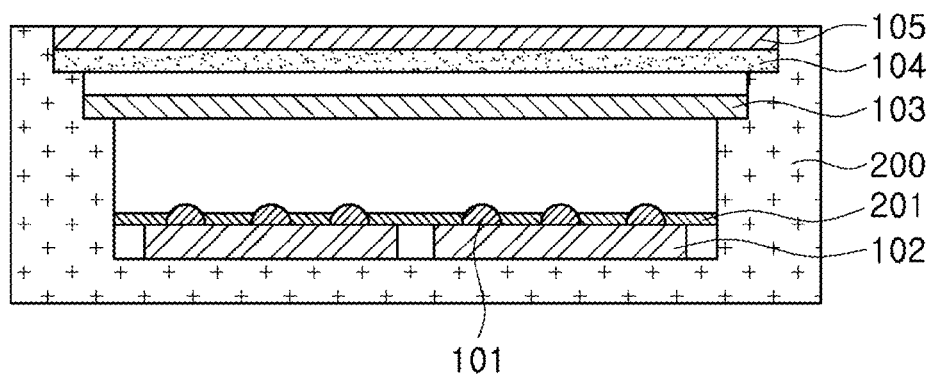

A light source module of FIG. 22 is different from the light source module of FIG. 1 in that the circuit board 102 is divided into two parts. The light source units 101 are disposed on each of the separated circuit boards 102, and the light source units 101 disposed on the different circuit boards 102 can be independently controlled. A light source module of FIG. 23 includes a support 200 in the form of a chassis, and the light source units 101, the circuit board 102, the optical sheet 103, the diffusion sheet 104, and the luminance enhancement sheet 104 are provided in the interior of the support 200. Also, a reflective part 201 may be disposed on the circuit board 102 in order to induce light toward the optical sheet 103. The reflective part 201 may also be employed in the above-described embodiments.

Various additional exemplary embodiments of lens units, lead frames, and wavelength conversion layers are described below with respect to FIGS. 24-34. Features described with respect to these embodiments may be utilized as described or may be incorporated singularly or together into one of ore of the other embodiments described herein.

Figure 24:
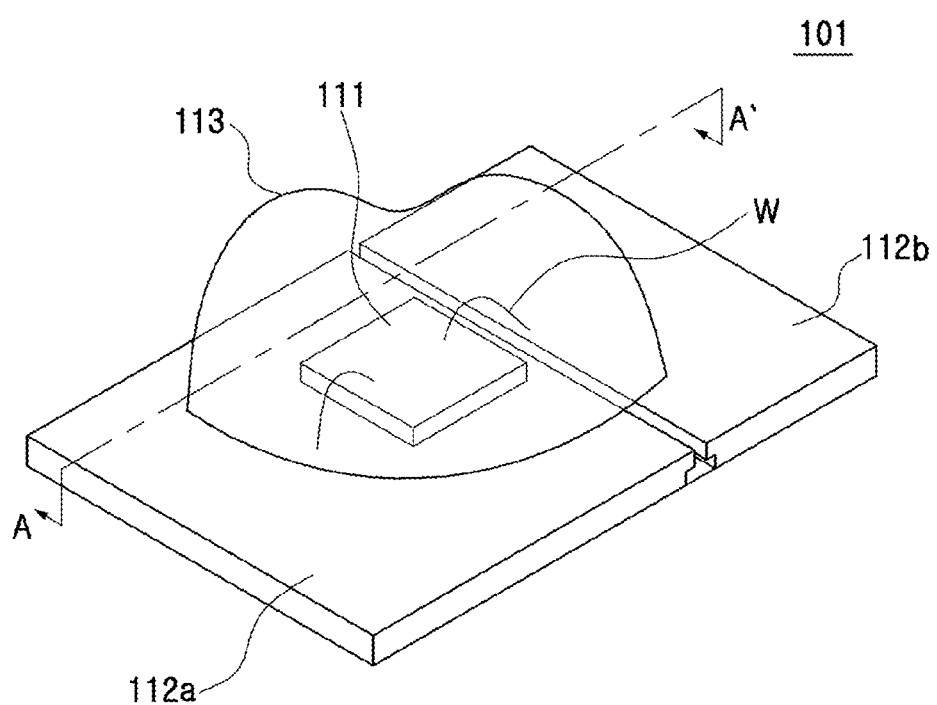
FIG. 24 is a schematic perspective view of another exemplary light source unit.
Figure 25:
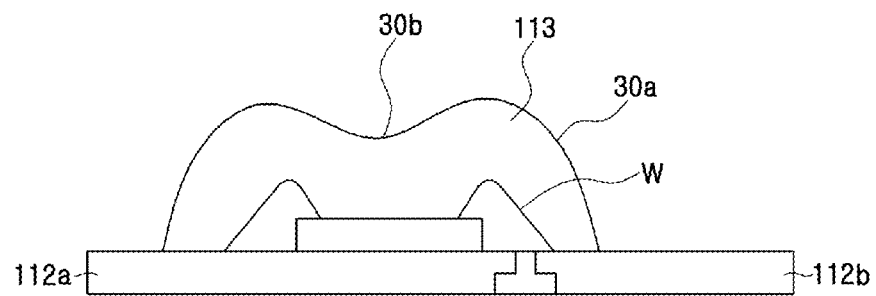
FIG. 25 is a cross-sectional view of the light source unit of FIG. 19, taken along line A-A'.
Figure 26:
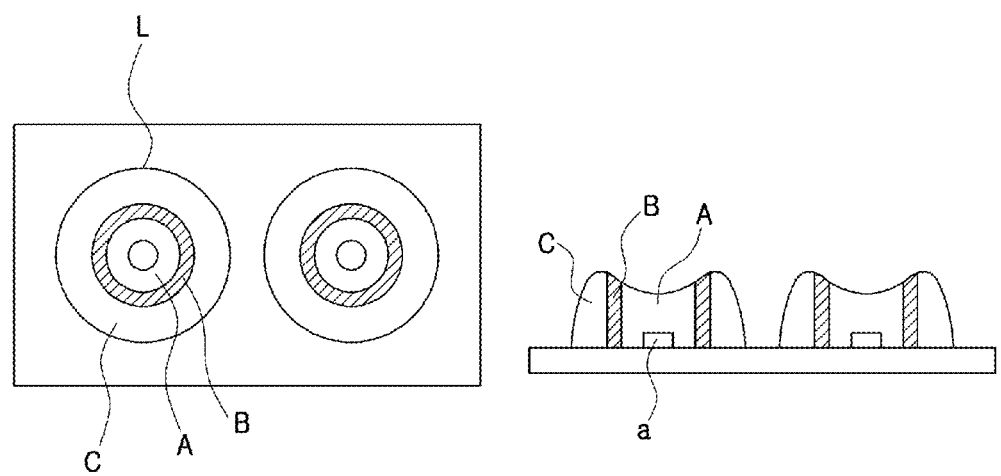
FIGS. 26(a) and 26(b) are diagrams, each schematically illustrating a luminance distribution at an upper surface of a lens unit including a convex portion and a concave portion formed within the convex portion.
Figure 27:
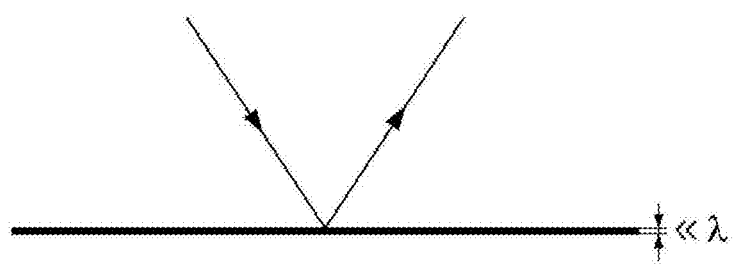
FIGS. 27(a) and 27(b), FIGS. 28(a) and 28(b) and FIGS. 29(a) and 29(b), respectively show a diagram and a photograph explaining a light distribution according to a surface roughness of a lead frame.
Figure 27:
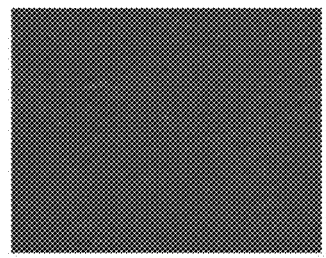
Figure 28:
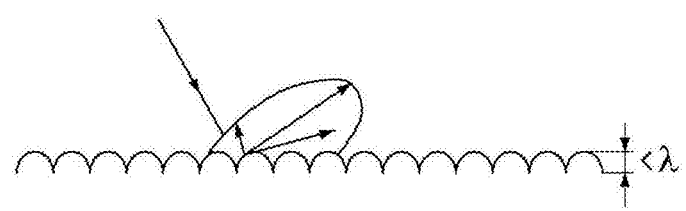
Figure 28:
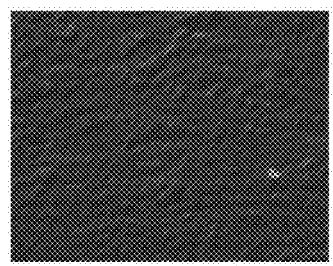
Figure 29:
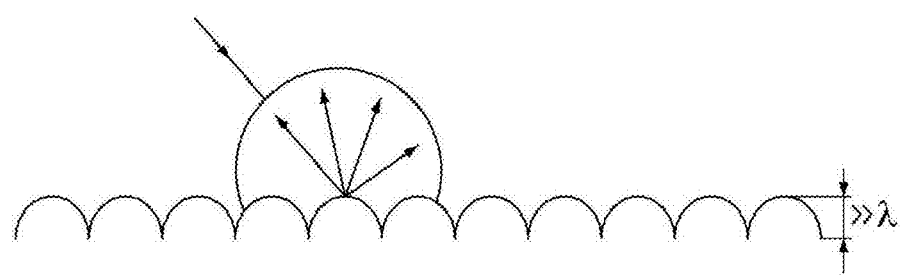
Figure 29:
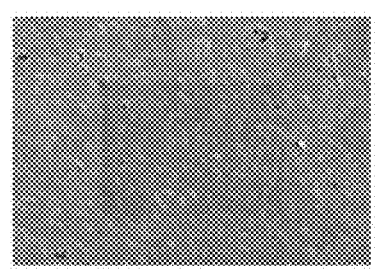

FIGS. 24 and 25 illustrate an exemplary light source unit 101, including a lens unit 113. FIG. 24 is a schematic perspective view of the light source unit 101. FIG. 25 is a cross sectional view of the light source unit of FIG. 24, taken along line AA'. Referring to FIGS. 24 and 25, a light emitting device package 100 according to an exemplary embodiment may include at least one light emitting element 111, lead frames 112a and 112b, one of which has the light emitting element 111 disposed on a surface thereof. The surface on which the light emitting element 111 is disposed is a rough surface so as to scatter at least a part of light emitted from the light emitting element 111. The lens unit 113 comprises a light-transmitting resin formed to cover at least a portion of the lead frames 112a and 112b and the light emitting element 111, and a surface of the lens unit 113 has a portion with a concave shape.

Electrodes (not shown) formed on the light emitting element 111 may be wire bonded to the pair of the lead frames 112a and 112b, and may receive an electrical signal from the outside. The light emitting element 111 may be wire bonded to each of the pair of lead frames 112a and 112b through an anode formed on the light emitting element 111. Alternately, the light emitting element 111 may be directly electrically connected with the one lead frame 112a provided as a mounting area of the light emitting element 111, without the use of a wire, and may be connected with the other lead frame 112b through a conductive wire. Concrete connection methods may be variously modified according requirements. While FIGS. 24 and 25 illustrate one light emitting element 111 included in one light source unit 101, two or more light emitting elements 111 may be included on one lead frame 112a or 112b.

The lens unit 113 may be formed on the upper surface of the light emitting element 111 so as to cover the at least a portion of the lead frames 112a and 112b and the light emitting element 111. As long as the material forming the lens unit 113 is light-transmitting, an ingredient thereof is not specifically limited, and an insulating resin having light-transmitting properties, such as a silicone resin composition, a modified silicone resin composition, an epoxy resin composition, a modified epoxy resin composition, an acrylic resin composition, or the like, may be used. Further, a resin having superior weather resistance, such as a hybrid resin or the like may be used, which includes at least one of silicon, epoxy, and fluorine resins. The material of the lens unit 113 is not limited to an organic material, and an inorganic material having superior lightfastness, such as glass, silica gel, or the like may be used therefor. In addition, the surface shape of the lens unit 113 may be adjusted to allow for the function of the lens, and particularly, to have a shape such as a convex lens, a concave lens, an oval or the like, thereby controlling light distribution.

When the lens unit 113 formed on a light emitting surface of the light emitting element 111 has an upwardly projecting hemispheric shape, a center area of the light emitting element 111 has the maximum level of luminance, while luminance is reduced towards to the circumference of the light emitting element 111, thereby having the form of a spot point light. Therefore, when a plurality of light emitting elements are used to form a surface light source, for example, used as the light source of light source module 100, for example, attempts to uniformly diffuse light incident from the light emitting element by disposing the diffusion sheet 104 over the light emitting elements 111, and further, to obtain a uniform surface light source by adjusting a distance between the light source units 101 and the diffusion sheet 104 may be made. However, the distance between the light source units 111 and the diffusion sheet 104 may be increased in order to obtain a uniform luminance value across the diffusion sheet, and thus, the thickness of a light source apparatus may be increased while overall luminance may be reduced. Additionally, an optical sheet 103, as described herein may also be used.

The lens unit 113, formed to cover at least a portion of the lead frames 112a and 112b and the light emitting element 111, has a surface, a portion of which has a concave shape, whereby an orientation angle of light emitted from the lens unit 113 may be widened as compared to the light emitted from the light emitting element 111, and a light distribution may be varied. Specifically, as shown in FIGS. 24 and 25, the lens unit 113 may have a concave portion 30b formed over the upper surface of the light emitting element 111 and a convex portion 30a formed around the concave portion 30b. The concave portion 30b may be formed in a center area of the convex portion 30a in such a manner as to have a diameter smaller than the maximum diameter of the convex portion 30a, and the center points of the convex portion 30a and the concave portion 30b may be aligned with each other. In this case, the light emitting element 111 may be disposed on the center line of the convex portion 30a and the concave portion 30b.

In a case in which the lens unit 113 having a shape shown in FIGS. 24 and 25 is provided, the maximum luminance value is shown at a position spaced apart from the light emitting element 111 by a predetermined distance, unlike in the case of a lens having an upwardly projecting hemispheric shape. In particular, the brightest area having a ring shape may be formed in a convex boundary portion of the convex portion 30a and the concave portion 30b, and the next brightest area may be formed around the center of the light emitting element 111.

FIGS. 26(a) and 26(b) are diagrams, each schematically illustrating a luminance distribution in an upper surface of a lens unit including a convex portion and a concave portion formed within the convex portion. FIG. 26(a) is a schematic diagram illustrating the lens when viewed from above, and FIG. 26(b) is a schematic diagram illustrating the lens when viewed from the side. Referring to FIGS. 26(a) and 26(b), a light emitting element a is disposed below an area A of a lens L shown in FIG. 26(a), a concave portion is formed on the disposition area of the light emitting element a, and the lens L has a bulged shape overall. In this case, as mentioned above, since a high luminance value may be exhibited in the disposition area A of the light emitting element and at a position C formed to be spaced apart from the light emitting element a by a predetermined distance, a dark portion having a ring shape (hereafter, referred to as a dark ring) may be generated at a boundary portion B between the area A and the position C.

The dark ring B, which may be evident as a result of the lens unit 113 having convex and concave shapes, may be removed by controlling the surface roughnesses of the lead frames 112a and 112b on which the light emitting element 111 is mounted, whereby the light source unit 101 may have improved optical uniformity and a wide orientation angle. The lead frames 112a and 112b may be formed to have rough surfaces to thereby provide a surface light source having improved optical uniformity by increasing the light scattering rate at the surfaces of the lead frames 112a and 112b.

FIGS. 27(a) and 27(b), FIGS. 28(a) and 28(b) and FIGS. 29(a) and 29(b), respectively show a diagram and a photograph explaining a light distribution according to a surface roughness of a lead frame. Referring to FIG. 27(a), in the case of a mirror surface having a low level of surface roughness (a roughness on the nano scale, less than several nm), it is in compliance with a reflection law in which an incident angle and a reflection angle have the same size. That is, an incident angle refers to an angle formed by a direction of light with respect to a straight line (a normal) perpendicular to a boundary surface, and a reflection angle refers to an angle formed by a direction of light when the light is reflected from the boundary surface to go on with respect to the normal. In an ideal mirror surface, light incident on the surface of a lead frame is reflected to have a reflection angle the same as an incident angle, and no surface scattering is generated. FIGS. 28(a) and 28(b) show light distribution in the case of a surface roughness on a submicron scale or less, and the light distribution of reflected incident light has an internal reflection and a slight scattering distribution. That is, a part of the incident light is reflected and a slight scattering distribution occurs at the surface of the lead frame. This scattering is referred to as Gaussian scattering. Next, FIGS. 29(a) and 29(b) show light distribution in the case of a surface roughness on a micron scale or less. In this case, there is a low level of light distribution within reflected light, and a light scattering distribution is generated at the surface of the lead frame. This scattering is referred to as Lambertian scattering.

The lead frames 112a and 112b may have a surface roughness which generates Lambertian scattering as shown in FIGS. 29(a) and 29(b), and more particularly, prominences and depressions shown in FIG. 29(a) may have a width of approximately 5 μm. The surface glossiness of the lead frames 112a and 112b may be numerically expressed by using a GAM index. This is to indicate a value when measuring the surface glossiness by using a photometer of GAM, Inc. Light mirror-reflected (regularly reflected) from the surfaces of the lead frames 112a and 112b is measured, thereby being numerically expressed as having a value within the range of 0 to 4. A regular reflection refers to a reflection generated on a mirror-like smooth surface, and refers to the light reflected to have a reflection angle the same as an incidence angle, as described above. A GAM index, in a case in which all light is scattered on a metal surface, without any of the light thereof being regularly reflected is referred to as 0. A GAM index, in a case in which all incident light is reflected is referred to as 4. That is, closer to 0, a rougher surface is obtained, while closer to 4, a smoother surface is obtained. Therefore, as a regular reflection ratio increases, a ratio in which light is diffused and reflected through scattering is reduced. The lead frames 112a and 112b may have a GAM index of approximately 0.4 to 1.0.

Referring to FIGS. 24 and 25, the lead frames 112a and 112b may be provided as the mounting area of the light emitting element 111, and the at the same time, may act as a terminal for applying an electrical signal supplied from the outside to the light emitting element 111. To this end, the lead frames 112a and 112b may be made of a metal material having superior electrical conductivity, and a pair of the lead frames 112a and 112b may be electrically insulated from each other. The surfaces of the lead frames 112a and 112b may be plated with silver (Ag), gold (Au), palladium (Pd), rhodium (Rh), or the like, in order to prevent the corrosion of a metal.

The lead frames 112a and 112b may be subjected to a smooth surface treatment in order to increase surface reflectance, thereby enhancing luminance, and may be made of a highly reflective metal, for example, silver (Ag), nickel (Ni), aluminum (Al), rhodium (Rh), palladium (Pd), iridium (Ir), ruthenium (Ru), magnesium (Mg), Zinc (Zn), platinum (Pt), gold (Au) or the like. However, as discussed above, the surfaces of the lead frames 112a and 112b applied to the bulged shaped lens unit including the concave portion may be roughened to thereby increase a diffuse reflectance ratio thereof, whereby a light source unit having a wide orientation angle without a reduction of luminance may be provided.

FIGS. 30(a) and 30(b) show a radiation pattern and a luminance distribution according to a GAM index of a lead frame in a light emitting device package according to an exemplary embodiment. FIG. 30(a) shows a radiation pattern according to a GAM index, and FIG. 30(b) shows a luminance distribution according to a GAM index. Referring to FIG. 30(a), 'a' is a radiation pattern when a GAM index is 1.2; 'b' is a radiation pattern when a GAM index is 0.65; and c is a radiation pattern when a GAM index is 0.24. As mentioned above, when a lens unit 113 having a concave portion 30b in a center area of a convex portion 30a is provided, given that a peak to peak angle representing the maximum luminance value is referred to as an orientation angle, the orientation angle is approximately 127°. Here, when the lead frame has a smooth surface (a GAM index is about 1.2, shown as a in FIG. 30(a)), a relatively high value of luminance is exhibited in the upper portion of the disposition area of the light emitting device, rather than the circumferential area thereof, as indicated by a shown in FIG. 30(a). Thus, a dark ring may be evident in the circumferential area of the light emitting element. However, when the diffusion reflectance ratio is increased by roughening the surface of the lead frame, as compared to a regular reflection ratio, luminance directly over the disposition area of the light emitting element may be reduced such that the dark ring may be removed, as indicated by b (a GAM index is 0.65) and c (a GAM index is 0.24) shown in FIG. 30(a).

A light source unit according to an exemplary embodiment may provide a substantially flat area having an almost uniform luminance value, in the region of an reflection angle of 20° or less, based on the disposition area of the light emitting element 111. In particular, when it is assumed that the maximum luminance value in the light source unit 101 is 1, a luminance value in the flat area may be in the range of approximately 0.29 to 0.34, and the value is almost uniformly maintained within the flat area. With the flat area formed above the upper portion of the light emitting element 111, the occurrence of the dark ring may be inhibited, whereby the optical uniformity of the light source unit 101 may be improved.

A light emitting element package including a lens unit as described may provide a luminance that is substantially flat within a radiation angle range of about 20° or less, with a maximum luminance exhibited within a radiation angle range of about 50° or more. An area of the light distribution pattern in which a luminance is maintained to be substantially flat may have a luminance value of 0.29 to 0.39, as compared to a maximum luminance.

Figure 30:
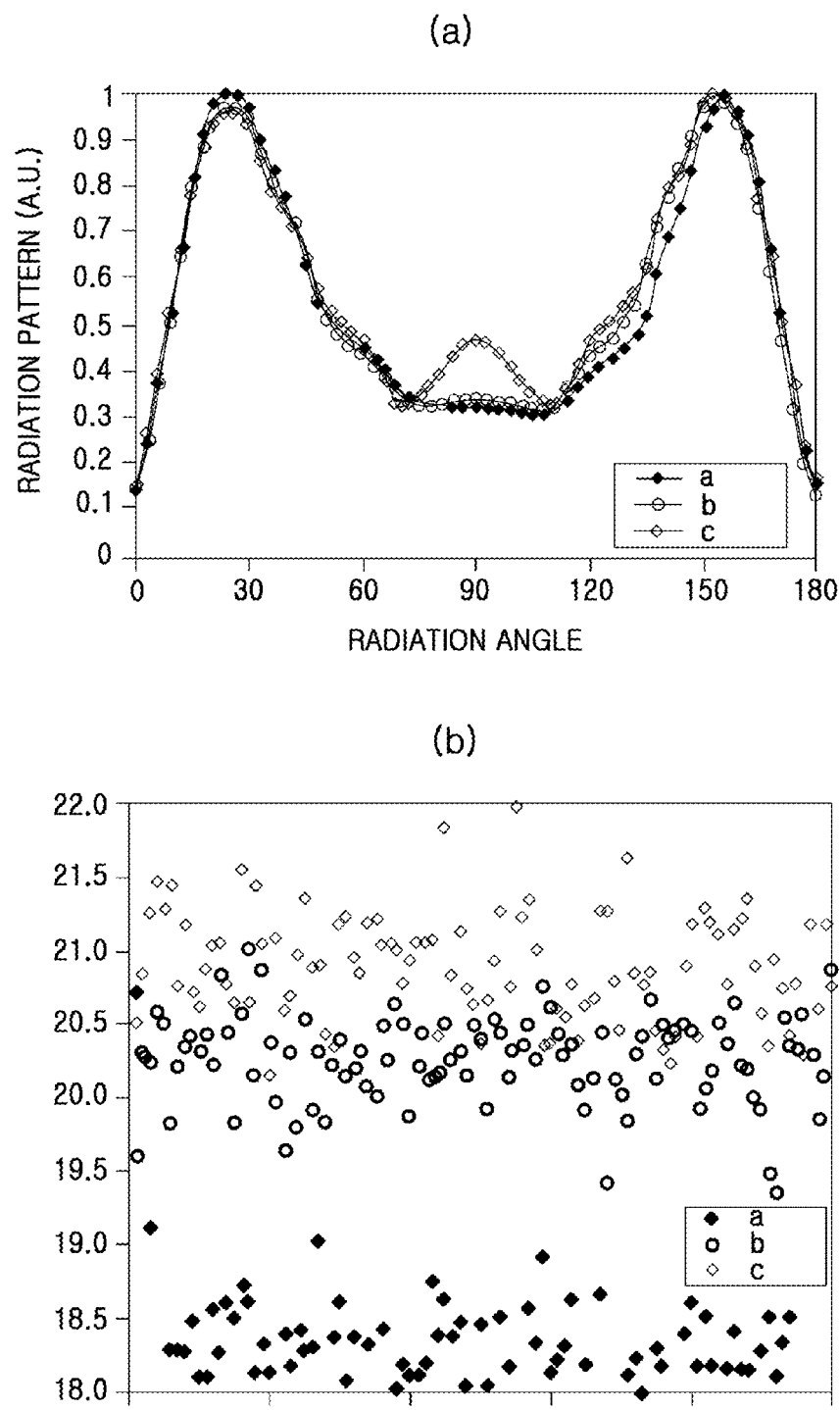
FIGS. 30(a) and 30(b) show a radiation pattern and a luminance distribution according to a GAM index of a lead frame in a light emitting device package according to an exemplary embodiment.

Referring to FIG. 30(*b*), the variation of a luminance distribution according to a GAM index is illustrated. As for c, in a case in which the surface of lead frame has the highest level of smoothness, a luminance value is high. Referring to b, it can be seen that the luminance value of b is barely different from that of c, even though the GAM index is reduced to 0.65. However, in the case of a, in which the GAM index is 0.24, the luminance value is significantly lowered compared to that of c. Accordingly, in a case in which the lead frame is allowed to have the GAM index in the range of 0.4 to 1.0, the dark ring without the lowering of luminance may be removed. In other words, the surface roughness of the lead frame may be controlled in order to remove the dark ring generated in by a lens unit having concave portion, provided on the upper surface of the light emitting device to widen an orientation angle, whereby optical uniformity and luminance may be improved. Thus, the effect of reducing the thickness of the light source module may be obtained in the case of using the light source unit as the light source of a backlight unit.

Figure 31:
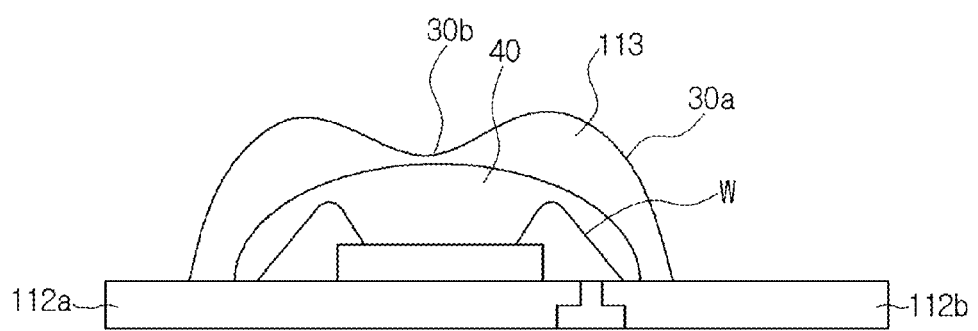
FIG. 31 is a diagram illustrating a light source unit according to an exemplary embodiment, when viewed from the side

FIG. 31 is a diagram illustrating a light source unit according to another exemplary embodiment, when viewed from the side. The light source unit of FIG. 31 includes a wavelength conversion layer 40 provided on a light emitting surface of the light emitting element 111, and having phosphor particles for wavelength conversion. The wavelength conversion layer may have a thickness of about 350 μm or more. The phosphor may be made of a fluorescent substance converting the wavelength of light into yellow, red, or green light. The kinds of fluorescent substance may be determined by a wavelength emitted from the active layer of the light emitting element 111. In particular, the wavelength conversion layer 40 may be made of a YAG, a TAG, a silicate, a sulfide or a nitride fluorescent material. Specifically, a green phosphor material may be at least one phosphor selected from the group consisting of β-SiAlON phosphor, MSiON phosphor ($MSi_2O_2N_2$:Eu, M is at least one of Sr, Ba and Ca), GAL phosphor ($Lu_3Al_5O_{12}$:Ce) and Silicate phosphor ($M_2SiO_4$: Eu, M is at least one of Sr, Ba, Ca, Mg, Cl and F). A red phosphor material may be at least one phosphor selected from the group consisting of $MSiAlN_3$:Eu (M is at least one of Sr, Ba, Ca, Mg, Cl and F), $M_2Si_5N_8$:Eu (M is at least one of Sr, Ba, Ca, Mg, Cl and F) and $M_{1-y}A_{1+x}Si_{4-x}O_{x+2y}N_{7-x-2y}$:RE (M is at least one of Ba, Sr, Ca and Mg, A is at least one of Al, Ga and B, RE is at least one of rare earth metal, Y, La and Sc). A yellow or orange phosphor may be at least one of phosphor selected from the group consisting of α-SiAlON, YAG and $Ce_zLa_{3-x-z}Ca_{1.5x}Si_6O_yN_{11-y}$. By using the green, red and phosphor material, a color reproduction can be improved.

In addition, the wavelength conversion layer 40 may include quantum dots. The quantum dot may be a nano crystal of a semiconductor material having a diameter of approximately 1 to 10 nm, and may be a material exhibiting quantum confinement effects. The quantum dots may convert the wavelength of light emitted from a light emitting structure to thereby provide wavelength-converted light, that is, fluorescence. For example, an Si nano crystal, a group II-VI compound semiconductor nano crystal, a group III-V compound semiconductor nano crystal, a group IV-VI compound semiconductor nano crystal or the like may be used as a quantum dot. Each of the nano crystals may be used separately, or a mixture thereof may be used.

As for a quantum material, the group II-VI compound semiconductor nano crystal may be any one selected from the group consisting of CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HggZnTe, CdZnSeS, CdZnSeTe, CdZnSTe, CdHgSeS, CdHgSeTe, CdHgSTe, HgZnSeS, HgZnSeTe, and HgZnST The group III-V compound semiconductor nano crystal may be any one selected from the group consisting of GaN, GaP, GaAs, AN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, and InAlPAs. The group IV-VI compound semiconductor nano crystal may be, for example, SbTe.

The quantum dots may be dispersed in a dispersive medium, such as a polymer resin in such a manner as to be naturally dispersed therein. Any transparent medium may be used as the dispersive medium of the wavelength conversion layer 40, as long as it is not deteriorated by light or does not reflect light, will not cause optical absorption, and will not substantially affect the wavelength conversion function of the quantum dot. For example, an organic solvent may include at least one of toluene, chloroform, and ethanol, and the polymer resin may include at least one of epoxy, silicon, polystyrene, and acrylate.

The radiation of a quantum dot may be generated during the transfer of an electron in an excited state from a conduction band to a valence band, and may exhibit characteristics in which wavelength thereof is varied according to the size of particles of a material, even in the case of the same material. Since light having a short wavelength is emitted when the size of the quantum dot is small, light of a desired wavelength region may be obtained by adjusting the size of the quantum dot. In this case, the size of the quantum dot may be adjustable by appropriately changing the nano crystal growth conditions.

According to an aspect of an exemplary embodiment, if no wavelength conversion layer 40 is used, wavelength conversion members, such as phosphor particles or quantum dots may be dispersed within the lens unit 113. The wavelength conversion members may be uniformly mixed in the lens unit 113, and may include quantum dots made of a YAG, a TAG, a silicate, a sulfide or a nitride fluorescent material, or a Si nano crystal, a group II-VI compound semiconductor nano crystal, a group III-V compound semiconductor nano crystal or a group IV-VI compound semiconductor nano crystal. In addition, an appropriate material, such as a viscosity extender, a light diffusing agent, a pigment, a fluorescent material, or the like may be added to the lens unit 113, as would be understood by one of skill in the art. The light diffusing agent may favorably reflect light emitted from the light emitting element 111 and the fluorescent material to thereby inhibit a color unevenness by the fluorescent material having a large particle diameter. Meanwhile, filler particles formed to have a diameter of about 5 μm to about 100 μm are contained in the lens unit 112, whereby the thermal shock resistance of the lens unit 113 may be improved.

Figure 33:
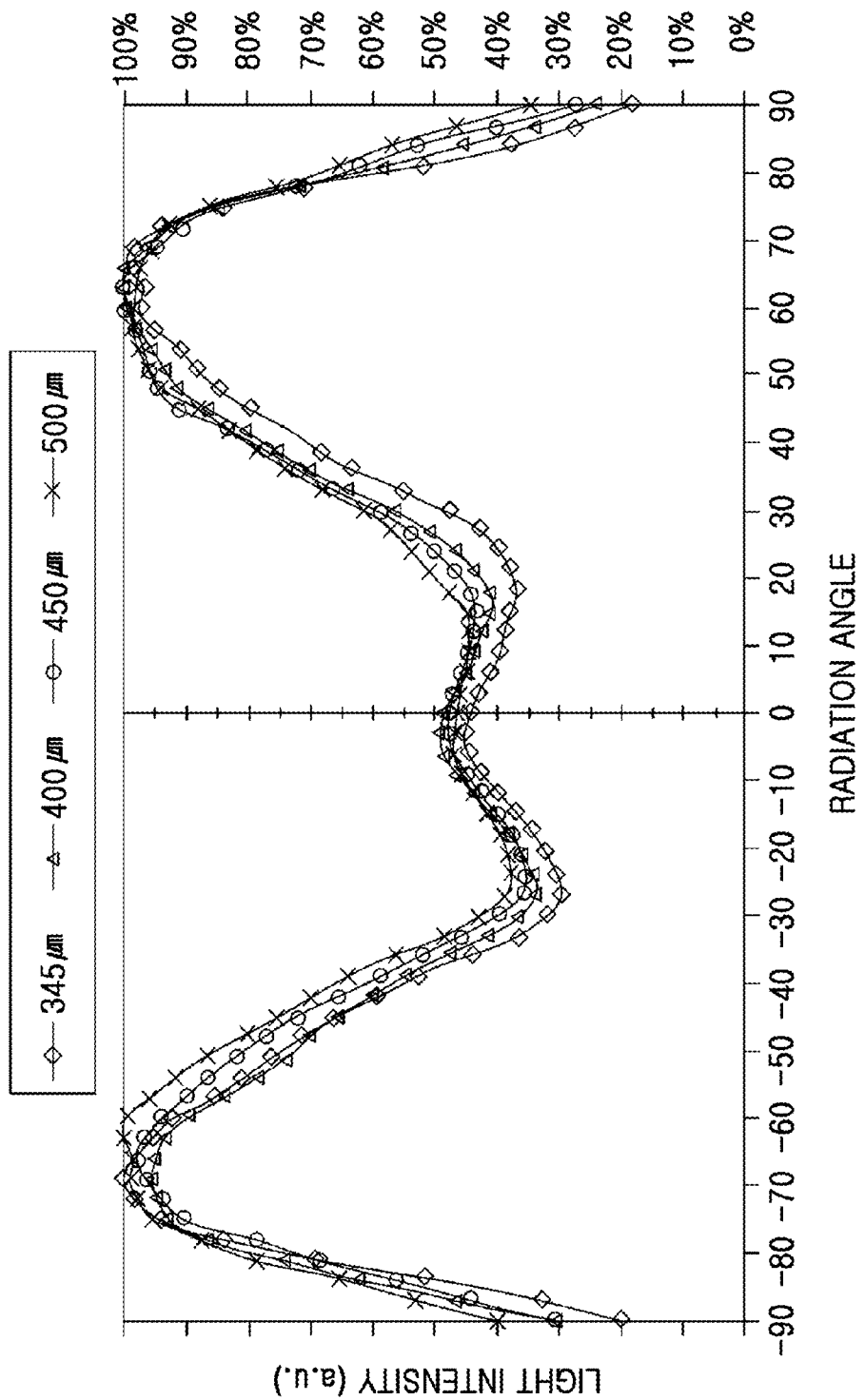
FIG. 33 shows a radiation pattern of a light emitting device package according to a thickness of a wavelength conversion layer thereof.
Figure 34:
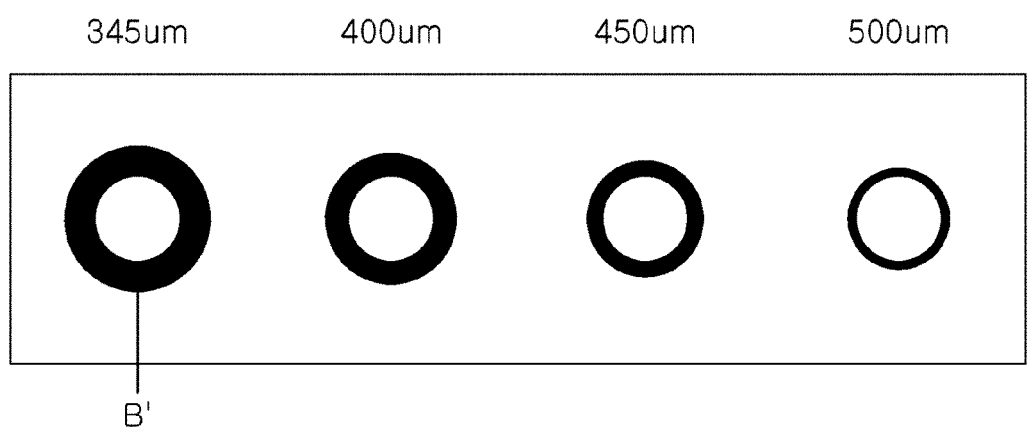
FIG. 34 is a diagram schematically illustrating a luminance distribution of the light emitting device package of FIG. 33.

FIG. 33 shows a radiation pattern of a light emitting device package according to a thickness of a wavelength conversion layer thereof. FIG. 34 is a diagram schematically illustrating a luminance distribution of the light emitting device package of FIG. 33. More particularly, with respect to identical lens units having surfaces, portions of which are concave, in the case of variations in the thickness of a wavelength conversion layer including a phosphor, variations in radiation pattern and luminance distribution are illustrated. Referring to FIGS. 33 and 34, when the thickness of the wavelength conversion layer of the light source unit is varied from 345 μm to 500 μm, it can be confirmed that both an orientation angle and luminance are varied. As the thickness of the wavelength conversion layer becomes thicker, a peak to peak value in the radiation pattern is smaller and a luminance value at the dark ring B' showing in the boundary between the upper portion of the light emitting element and a peak point is greater. As shown in FIG. 34, since the dark ring B' showing in the boundary between the upper portion of the light emitting element and the peak point may be rapidly reduced as a luminance value is increased, whereby the dark ring B' may be removed by controlling the thickness of the wavelength conversion layer.

Figure 32:
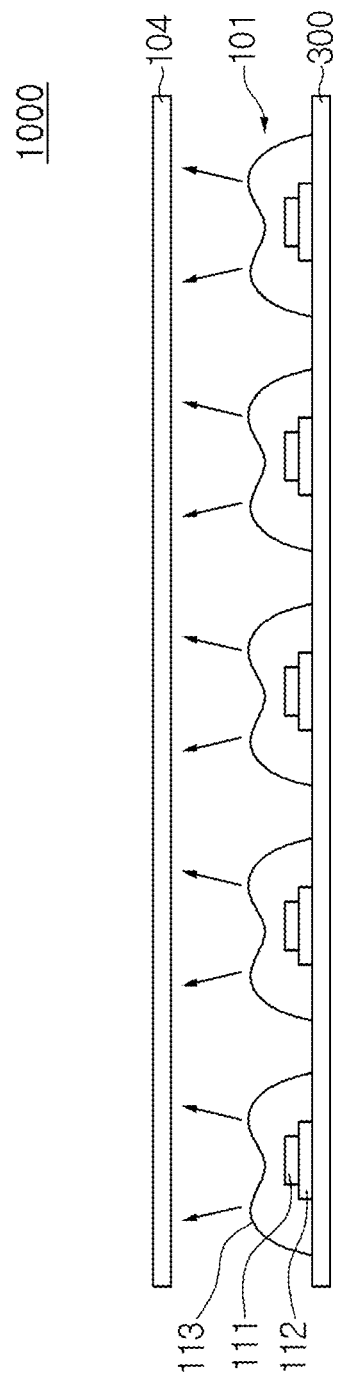
FIG. 32 is a diagram illustrating a backlight unit according to an exemplary embodiment, when viewed from the side.

FIG. 32 is a diagram illustrating a backlight unit according to an exemplary embodiment, when viewed from the side. Referring to FIG. 32, a light source module 100 may include a number of light source units 101, each including a light emitting element 111, a package substrate 112 (or lead frames 112a and 121b) having a surface on which the light emitting element 111 is disposed being a rough surface so as to scatter at least a part of light emitted from the light emitting element 111, and a lens unit 113 formed to cover at least a portion of the package substrate 112 and the light emitting device 111 and having a surface with a portion having a concave shape. A substrate 300 having circuit wiring formed thereon electrically connected with the light source units 101, and a diffusion sheet 104 which uniformly diffuses light incident from the light source units 101.

The substrate 300 on which the light source units 101 are disposed may be a circuit board 102, and may be formed of an organic resin material containing epoxy, triazine, silicon, polyimide or the like and other organic resin materials, or may be formed of a ceramic material such as AlN, $Al_2O_3$ or the like, a metal material, or a metal compound material. In particular, the substrate 300 may be a metal core printed circuit board (MCPCB), a kind of metal PCB. However, the substrate 300 is not limited to a PCB, and any substrate having wiring structures formed on both surfaces thereof, namely a surface on which the light source units 101 can be mounted and an opposite surface thereto, the wiring structures provided for driving the light source units 101, may be possible. Specifically, wirings for electrically connecting each light source unit 101 may be formed on a surface and an opposing surface of the substrate 300. A wiring formed on the surface of the substrate 300 on which the light source units are mounted may be connected to the other wiring formed on opposing surface through a through hole, or a bump (not shown).

In the direct type backlight unit using light emitting elements, a light source module including the light emitting elements or the like may be disposed below a liquid crystal panel, and the light source module may directly illuminate the liquid crystal panel. A diffusion sheet and an optical sheet, such a prism sheet or the like may be disposed over or within the light source module including a plurality of light emitting elements, whereby light emitted from the light emitting elements may be uniformly diffused. The diffusion sheet 104 may be a polyester substrate, and may contain diffusing particles having a spherical or oval shape in the diffusion sheet 104. These diffusing particles (not shown) may be made of an acrylic resin, and may perform the diffusing and mixing of light passing through the diffusion sheet 104.

In the light source module, luminance and optical uniformity may be controlled by a distance between the diffusion sheet 104 and the light source units 101. That is, as a height from the light source units 101 (or the substrate 300 or circuit board 102 on which they are disposed) to the diffusion sheet 104 is reduced and a pitch between the light source units may be increased such that optical uniformity may be degraded, whereby the dark ring between the light emitting devices may be evident. According to an exemplary embodiment, the light source units 101 in the light source module may have a wide orientation angle, such that the uniform surface light source may be obtained, with only a small number of light source units, whereby an economical light source module (or backlight unit including the same) may be obtained. Further, a light source module (or a backlight including the same) may be thinner and miniaturized because the distance between the light source units 101 and the diffusion sheet may be minimized.

Various additional exemplary embodiments of light emitting element packages including features providing improved heat emission efficiency and structural stability are described below with respect to FIGS. 35-45. The light emitting element package may be used as a light source unit as described above. Features described with respect to these embodiments may be utilized as described or may be incorporated singularly or together into one or more of the other embodiments described herein.

Figure 35:
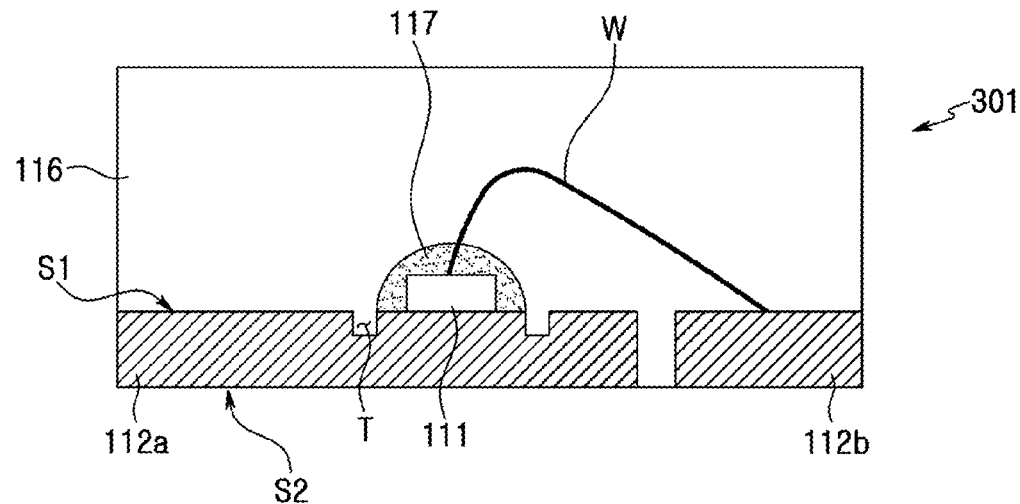
FIG. 35 is a cross-sectional view of a light emitting element package according to an exemplary embodiment.
Figure 36:
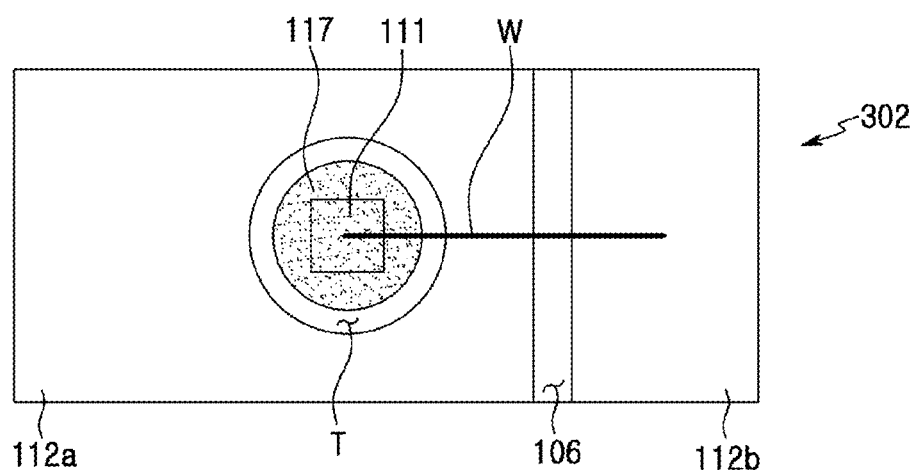
FIG. 36 is a plan view of the light emitting element package of FIG. 30 when viewed from above.
Figure 37:
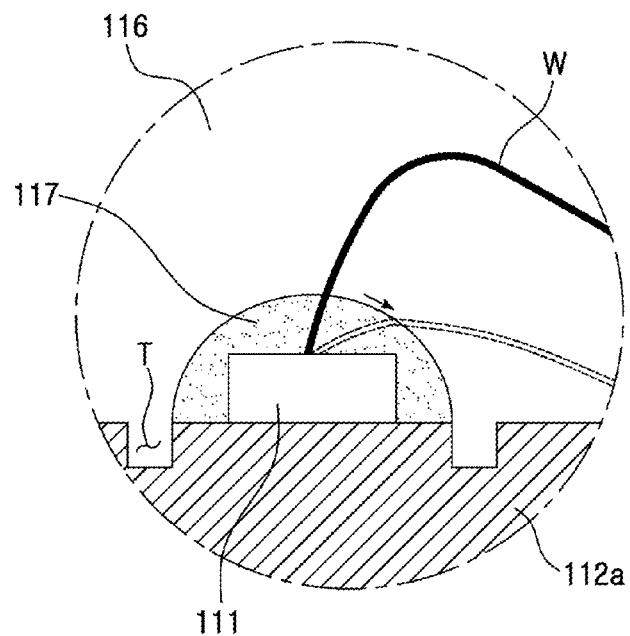
FIG. 37 is an enlarged view of a peripheral region of a wavelength conversion unit and a conductive wire in the light emitting element package shown in FIG. 30.
Figure 38:
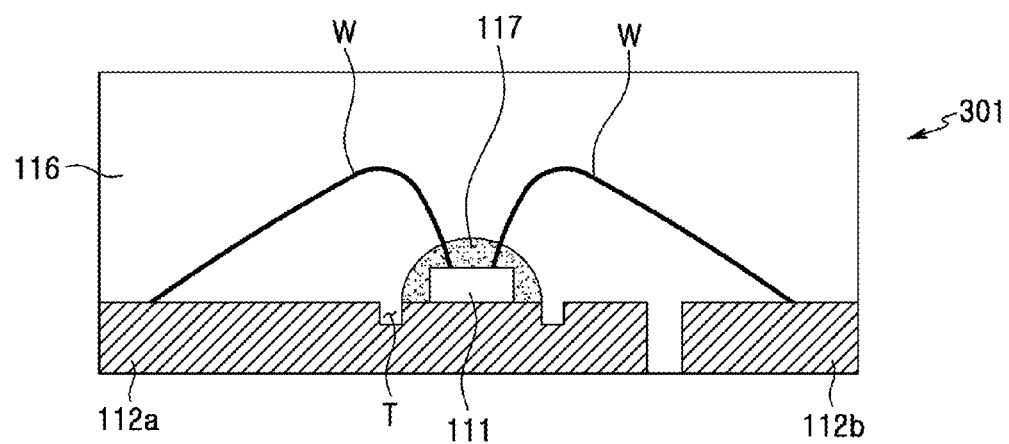
FIGS. 38, 39, and 40 are cross-sectional views of light emitting element packages according to exemplary embodiments.
Figure 39:
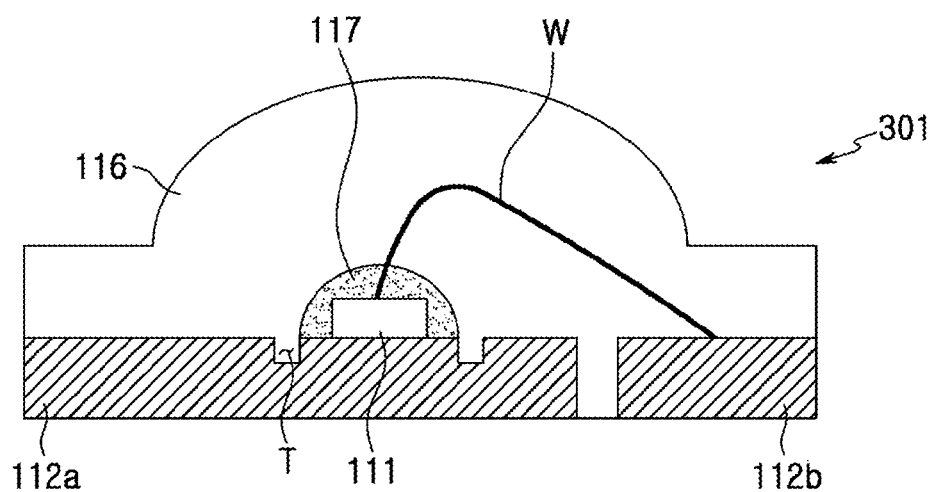

FIG. 35 is a cross-sectional view of a light source unit according to an exemplary embodiment, and FIG. 36 is a plan view of the light emitting element package of FIG. 35 when viewed from above. FIG. 37 is an enlarged view of a peripheral region of a wavelength conversion unit and a conductive wire in the light emitting element package shown in FIG. 35. Referring first to FIGS. 35 and 36, a light emitting element package 301 may include first and second lead frames 112a and 112b. The packages may provide electrical insulation. The first and second lead frames 112a and 112b may respectively have first and second principal surfaces S1 and S2. Each of the second principal surfaces S2 of the first and second lead frames 112a and 112b may be exposed to the outside so as not to be covered with a package body 116 with reference to FIG. 35. Accordingly, heat generated from a light emitting element 111 may be emitted to the outside through the first and second lead frames 112a and 112b. For effective light emission, the first and second lead frames 112a and 112b may be formed of a metal material having a high level of electrical and heat conductivity. The light emitting element 111 may be disposed on the first principal surface 51 of the first lead frame 112a. As the light emitting element 111, any device capable of emitting light in response to an electrical current applied thereto may be employed, but a light emitting diode may be used in consideration of light emission efficiency and the miniaturization of the device or the like.

The light emitting element 111 may be electrically connected with the first and second lead frames 112a and 112b to receive an external electrical signal, and may include a conductive wire W to be connected to the second lead frame 112b. Although FIG. 35 illustrates a case in which the light emitting element 111 is electrically connected to the first lead frame 112a through an electrode formed on a bottom of the light emitting element, the light emitting element may also be connected to the first lead frame 112a through a conductive wire W as in the case of the light emitting device package 101 according to the exemplary embodiment referred to in FIG. 38.

A wavelength conversion unit 117 adapted for use within the package body 116 may include a light converting material converting a wavelength of light emitted from the light emitting element 111, and for example, may be formed of a mixture of a silicon resin and a light conversion material. In this case, as the light conversion material there may be provided, for example, a fluorescent substance and a quantum dot. Light converted by the wavelength conversion unit 117 may be mixed with light emitted from the light emitting element 111, to provide white light in the light emitting element package 301. The wavelength conversion unit 117 may not be formed within the entire package body 116 that is formed of a transparent molding resin, but may be formed limitedly in a peripheral region of the light emitting element 111. Therefore, an actual reduction effect on a light source area provided by the light emitting element package 301 may be achieved, and the amount of light emitted with regard to the area of a light source may increase. As such, as the amount of light emitted with regard to the light source area increases, the light emitting element package 301 may be appropriately used for illuminating devices requiring a light source having a low etendue, such as a camera flash, an automobile head lamp, a projector light source, or the like.

As the structure in which the wavelength conversion unit 114 is limitedly provided in a peripheral region of the light emitting element 111, a trench structure T may be provided in the first principal surface S1 of the first lead frame 112a, and on a relatively protruded region defined by the trench structure T, that is, in an inner area of the trench structure T, the light emitting element 111 may be disposed. The wavelength conversion unit 117 may be formed to cover the light emitting element 111 and a portion of the conductive wire W may be limitedly provided to the protrusion region. By the trench structure T formed on the vicinity of the wavelength conversion unit 114, a shape of the wavelength conversion unit 114 may be maintained by a surface tension even before the hardening thereof, and the shape thereof may be for example, a hemisphere. At this time, in order to maintain the shape of the wavelength conversion unit 114, the shape of the conductive wire W should be appropriately controlled. With reference to FIG. 37, for example, in a case that the conductive wire W is allowed to serve as a support to maintain the shape of the wavelength conversion unit 117, the conductive wire W is located at a relatively low position as shown in a dotted line of FIG. 37; resin contained in the wavelength conversion unit 117 provided before the hardening may flow downward as shown in an arrow in the drawing, such that it may be difficult to maintain a required shape of the wavelength conversion unit 117.

To significantly reduce the occurrence of such defects, the conductive wire W may need to be adapted such that a portion thereof corresponding to an interface between the wavelength conversion unit 117 and the package body 116 may not be directed downward with reference to FIG. 37. Described in detail, a portion of the conductive wire W that penetrates through the wavelength conversion unit 117 and comes out of that may have a tilt that is greater than 0° and equal to or less than 180°, the tilt being provided by the second principal surfaces S2 of the first and second lead frames 112a and 112b. Accordingly, the resin may not flow downwardly, and here, a portion of the conductive wire directed downwardly of the second surface S2 may be defined as having negative tilt. In addition, in the case of the conductive wire W, a portion thereof provided externally of the wavelength conversion unit 117 is bent downward at a position higher than a height of the wavelength conversion unit 117, or a height of the portion thereof becomes greater or is maintained up to a boundary between the wavelength conversion unit 117 and the trench structure T, that is, up to a start point of the trench structure T; an effect of preventing resin from flowing downward may be increased. Meanwhile, a shape of the trench structure T may be appropriately selected depending upon a required shape of the wavelength conversion unit 117, and the trench structure may be ring shaped. Though FIG. 36 illustrates the circular-ring shaped wavelength conversion unit 117 as an example, a polygonally-ring shaped wavelength conversion unit may be applied.

The package body 116 may serve as a protector to protect constitutive elements received therein, also function to fix the first and second lead frames 112a and 112b, and be formed in an upper part of the first principal surface S1 and between the first and second lead frames 112a and 112b. A premolding method, that is, a structure in which a reflective cup shaped package body is filled with a transparent encapsulation material, is not required, but the package body 116 may be filled with a material, i.e., a silicon resin, an epoxy resin, or the like, having electrical insulation and translucency. Accordingly, a manufacturing process may be simplified and degradation of a premold as the package body which may occur when the device operates may be prevented. In addition, since factors generating a loss or distortion of light emitted from the light emitting element 111 are not desired, a light efficiency is prominent and a path distortion may not occur. It is illustrated that the surface of the package body 116 has a flat structure, but the package body 116 may have a lens shape as shown in the light emitting element package 301 shown in FIG. 39, and the lens shape may be formed on a path of light emitted from the light emitting element 111.

Figure 40:
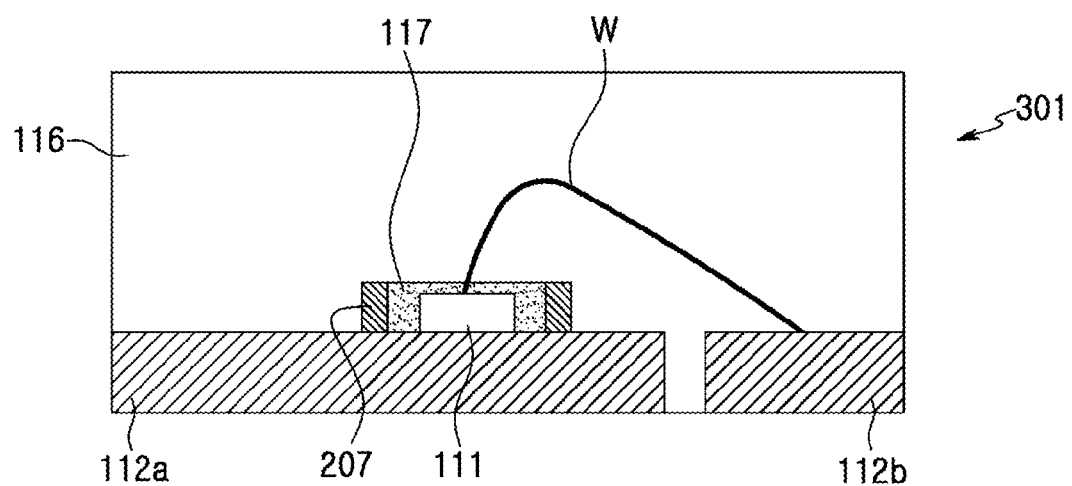

FIG. 40 is a cross-sectional view of a light emitting element package according to another exemplary embodiment. In the same manner as the embodiment described above, the light emitting element package 301 as shown in FIG. 40 may include first and second lead frames 112a and 112b, a light emitting element 111, a wavelength conversion unit 117, a conductive wire W, and a package body 116. A partition structure 207 may be provided on a first principal surface of the first lead frame 112a instead of the trench structure. The wavelength conversion unit 117 may be formed to be filled within the partition structure 207. The partition structure 207 may be adapted to facilitate the formation of the wavelength conversion unit 117. The partition structure 207 may be formed of a material, for example, a resin that may be obtained through a dispersion of white filler such as $TiO_2$ or a metal having a relatively high reflectivity, but it is not limited thereto. The partition structure 207 may have a ring shape, for example, be circularly or polygonally shaped, or be formed to have other shapes.

Figure 41:
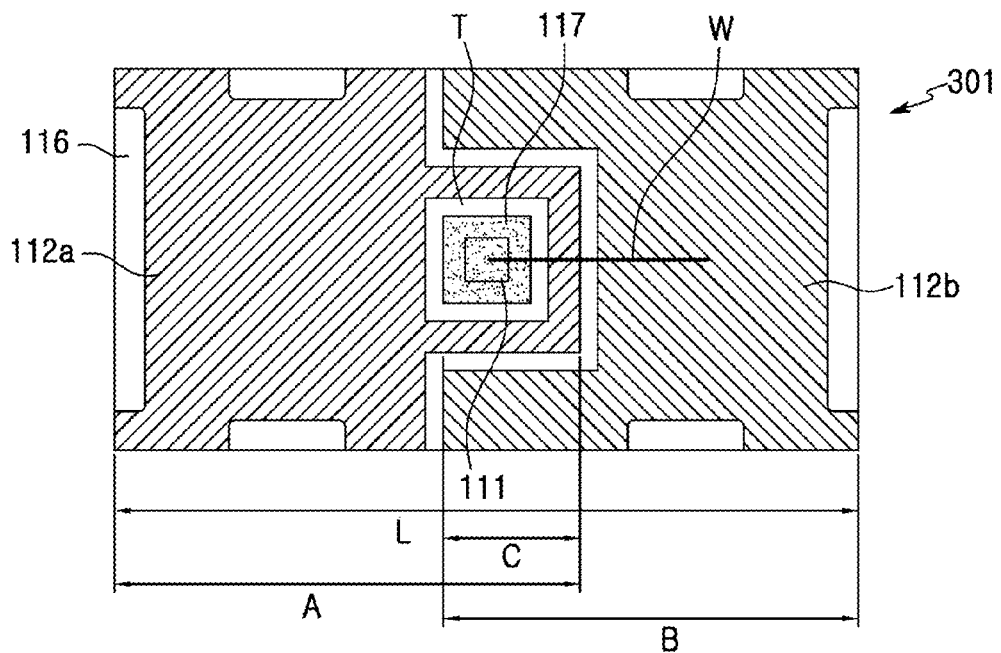
FIG. 41 is a plan view of a light emitting element package according to another exemplary embodiment.

FIG. 41 is a plan view of a light emitting device package according to another embodiment. A light emitting element package 301, as shown in FIG. 41, may include first and second lead frames 112a and 112b, a light emitting element 111, a wavelength conversion unit 117, a conductive wire W and a package body 116 similar to those shown and described with respect to FIG. 35. In this embodiment, a trench structure T may be formed on the first principal surface of the first lead frame 112a, but it is not limited thereto. The light emitting element 111 and the wavelength conversion unit 114 may be disposed on a protrusion region protruding in the area of the trench structure T. The first and second lead frames 112a and 112b may be formed to include partially-removed shapes in end surfaces between first and second principal surfaces as shown in FIG. 41, such that a contact area between the first and second lead frames 112a and 112b and the package body 116 may be increased to improve a bonding force therebetween. Since a silicon resin has a relatively low mechanical strength, a solution to improve the mechanical stability of the light emitting element package 301 may be used, that is, an increase in the contact area between the first and second lead frames 112a and 112b and the package body 116 may be undertaken.

In order to improve a mechanical strength of the light emitting element package 301, the first lead frame 112a may have a protrusion part formed thereon, and the second lead frame 112b may have a recessed part into which the protrusion part may be inserted. In detail, in the first lead frame 112a, one portion thereof may protrude toward the second lead frame 112b, to form the protrusion part. In the second lead frame 112b, one portion thereof may be recessed to form the recessed part and receive the protrusion part of the first lead frame 112a therein. Accordingly, the first lead frame 112a may be "T" shaped while the second lead frame 112b may be "U" shaped. In this case, the light emitting element 111 may be disposed on a region of the protrusion part of the first lead frame 112a. As such, an engagement structure for the protrusion part and the recessed part of the first and second lead frames 112a and 112b may be provided, thereby enhancing mechanical stability and particularly stability against a bending moment perpendicularly applied to the first and second principal surfaces.

In order to improve the mechanical strength of the lead frames, it may be desired to sufficiently secure the degrees of engagement between the protrusion part and the recessed part by appropriately controlling the size of the first and second lead frames 112a and 112b and the size of the protrusion part and the recessed part respectively provided therewith. In detail, a length A of the first lead frame 112a may be greater than or equal to half of the length L of the light emitting element package 301 on the basis of a direction in which the protrusion part is formed as a transverse direction in FIG. 41. In this case, the length A of the first lead frame 112a may correspond to a distance from an end surface thereof opposed to the protrusion part to an end of the protrusion part. In a similar manner thereto, the length B of the second lead frame 112b may be greater than or equal to half of the length L of the light emitting element package 301. Further, in the first and second lead frames 112a and 112b, a length C thereof, as an overlapping portion of the protrusion part and the recessed part, may be greater than or equal to a quarter of the length of the light emitting device package.

Figure 42:
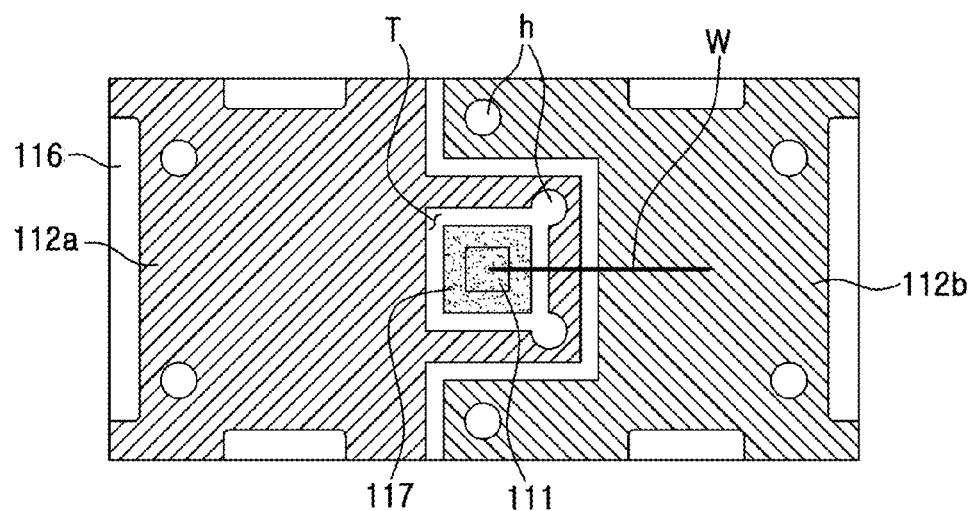
FIG. 42 is a plan view of a light emitting element package according to another exemplary embodiment.
Figure 43:
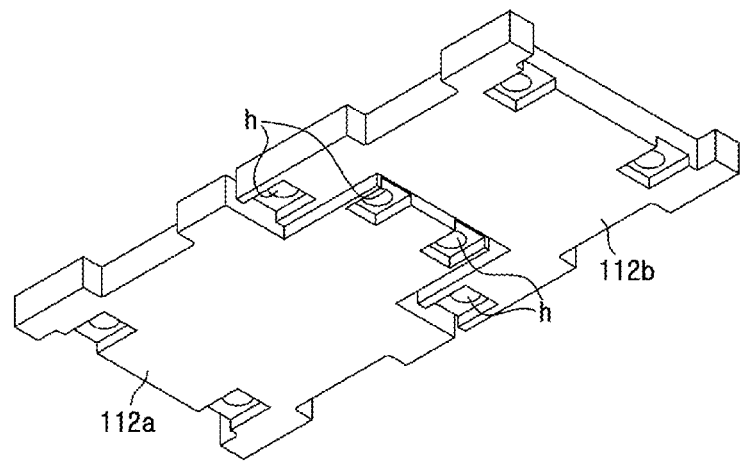
FIG. 43 is a schematic perspective view of first and second lead frames of the light emitting element package shown in FIG. 42.

FIG. 42 is a plan view of a light emitting element package according to another exemplary embodiment, and FIG. 43 is a schematic perspective view of first and second lead frames of the light emitting element package shown in FIG. 42. With reference to FIG. 42, a light emitting element package 301 may include first and second lead frames 112a and 112b, a light emitting element 111, a wavelength conversion unit 117, a conductive wire W and a package body 116 in a similar structure to that described and illustrated with respect to FIG. 41. A trench structure T may be formed in a first principal surface of the first lead frame 112a, and the light emitting element 111 and the wavelength conversion unit 117 may be formed on the protrusion region relatively defined by the trench structure T. Through holes h may be formed to penetrate through the first and second principal surfaces of the first and second lead frames 112a and 112b, and the package body 116 may be formed to fill the inside of the through holes h. This structure may improve a bonding force between the package body 116 and the first and second lead frames 112a and 112b. The through holes h of the first and second lead frames 112a and 112b may be formed in appropriate positions, for example, in edge portions of the first and second lead frames 112a and 112b, so as to obtain a stable combination force with the package body 116.

In addition, since a bending moment may be applied to be concentrated onto the respective peripheries of the protrusion part and the recessed part of the first and second lead frames 112a and 112b, the through holes h may be formed on the respective peripheries of the protrusion part and the recessed part. In this case, at least one of the through holes h of the second lead frame 112b may be formed in a position of the second lead frame that has a distance shorter than that of a position at which the through hole h of the first lead frame is formed on the protrusion part thereof, the distance being from one end surface of the first lead frame 112a opposed to the end surface thereof having the protrusion part formed therein. By this structure a mutually engagement force effect between the through holes h of the protrusion part and the through holes h of the recessed part may be improved.

In addition, a step coverage may be formed on the periphery of the through holes h while forming the through holes h in the first and second lead frames 112a and 112b, thereby increasing a combination force thereof with the package body 116. With reference to FIG. 43, on the second principal surfaces of the first and second lead frames 112a and 112b, a step coverage may be formed on a peripheral region of the through holes h, and the package body 116 may be formed on the region having the step coverage. Accordingly, a contact area and a bonding force between the first and second lead frames 112a and 112b and the package body 116 may increase, such that the mechanical stability may be expected by the through-holes h and step-coverage combined structure.

Figure 44:
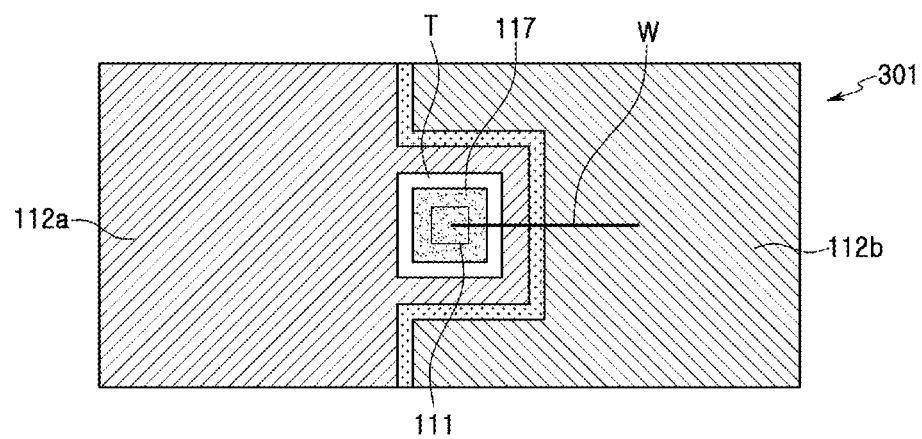
FIG. 44 is a plan view of a light emitting element package according to another exemplary embodiment.
Figure 45:
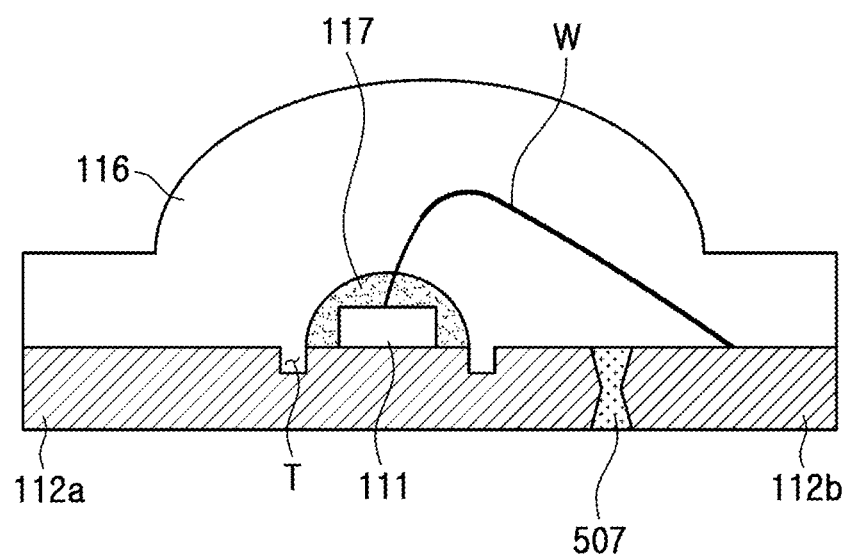
FIG. 45 is a cross-sectional view of the light emitting element package of FIG. 44.

FIGS. 44 and 45 are respectively a plan view and a cross-sectional view of a light emitting device package according to another exemplary embodiment. With reference to FIGS. 44 and 45, a light emitting element package 301 may include first and second lead frames 112a and 112b, a light emitting element 111, a wavelength conversion unit 117, a conductive wire W and a package body 116. In a manner similar to that described and illustrated above, a trench structure T may be formed in the first principal surface of the first lead frame 112a, and the light emitting element 111 and the wavelength conversion unit 117 may be formed on a protrusion region defined by the trench structure T. An insulation unit 507 may be formed on a region between the first and second lead frames 112a and 112b to connect therebetween. In this case, the insulation unit 507 may be formed of an oxide of a material forming the first and second lead frames 112a and 112b. For example, the first and second lead frames 112a and 112b may be formed of Al and the insulation unit 507 may be formed of $Al_2O_3$.

This structure may be obtained through an oxidization process in which a portion of a plate shaped metal of Al or the like is oxidized to be insulated in a thickness direction thereof and then separated into two electrodes, lead frames, or more. In this process case, the insulation unit 507 may have a shape in which on the basis of a thickness direction of the first and second lead frames 112a and 112b, a width of the insulation unit 507 narrows in a direction towards the inside of the insulation unit 507 from the surfaces thereof. Therefore, lead frames do not need to be cut to form electrical separation therebetween or separately arrange two lead frames or more, thereby providing a process convenience. This insulation unit 507 may be expanded in volume due to an oxidization reaction and may be easily damaged due to external impacts according to the material properties thereof, but according to this embodiment, a protrusion part and a recessed part may be formed in lead frames to be engaged therebetween, thereby significantly reducing a defect occurrence to obtain light emitting device packages having increased mechanical strength and resistance against external impacts.

As set forth above, in a light emitting element package described herein, a heat emission performance may be improved so as to significantly reduce a degradation of a resin part serving as a package body, and a combination force between lead frames and a package body may be increased to enhance structural reliability.

As set forth above, according to exemplary embodiments, in a light source module having a diffusion sheet, an optical distance can be shortened and the number of light sources can be reduced.

In addition, a backlight unit, a display apparatus, a television set, and an illumination apparatus can have excellent light uniformity while having a small thickness through the utilization of the light source module.

While exemplary embodiments have been shown and described herein, it will be apparent to those skilled in the art that modifications and variations can be made without departing from the spirit and scope of the invention as defined by the appended claims.

What is claimed is:

1. A light source module comprising:
   a plurality of light source units comprising a light emitting element emitting light when electricity is applied thereto;
   an optical sheet disposed above the plurality of light source units and exhibiting bidirectional transmittance distribution function characteristics comprising a first peak at a radiation angle less than 0° and a second peak at a radiation angle greater than 0°, and
   a diffusion sheet disposed in a path of light transmitted through the optical sheet after being emitted from the plurality of light source units, and comprising diffusion particles dispersed in the interior of a light-transmissive base,
   wherein the optical sheet comprises a plurality of pyramid-shaped structures, wherein at least one of the plurality of pyramid-shaped structures comprises a plurality of sloped faces which are sloped to a horizontal plane, wherein the plurality of sloped faces have different tilt angles, and
   the plurality of light source units are arranged on a circuit board, and a distance between the circuit board and the diffusion sheet is smaller than or equal to a half of a pitch between the plurality of light source units.

2. The module of claim 1, wherein the plurality of light source units exhibit a light distribution pattern comprising a first peak at a radiation angle less than 0° and a second peak at a radiation angle greater than 0°.

3. The module of claim 1, wherein an orientation angle of the plurality of light source units are 120° or greater.

4. The module of claim 3, wherein a difference between the radiation angle less than 0° and the radiation angle greater than 0° is 20° to 50°.

5. The module of claim 1, wherein the plurality of light source units exhibit a light distribution pattern having a peak at a radiation angle of 0°.

6. The module of claim 1, wherein the plurality of light source units comprise a lens unit disposed in a path of light emitted from the light emitting element.

7. The module of claim 6, wherein the plurality of light source units are a light emitting element package.

8. The module of claim 6, further comprising:
   a circuit board on which the light emitting element is mounted,
   wherein the lens unit is in contact with the circuit board.

9. The module of claim 6, wherein the lens unit comprises a recessed area disposed directly above the light emitting element, wherein the recessed area is recessed toward the light emitting element with respect to other areas of the lens unit.

10. The module of claim 1, wherein the sloped faces of mutually adjacent pyramid-shaped structures among the plurality of pyramid-shaped structures have different tilt angles.

11. The module of claim 1, wherein the plurality of pyramid-shaped structures have different sizes, and based on one of the plurality of pyramid-shaped structures, others of the plurality of pyramid-shaped structures are aperiodically disposed in a vicinity of the one of the plurality of pyramid-shaped structures, and the aperiodical disposition structure is periodically repeated within the depression and protrusion structure.

12. The module of claim 1, wherein at least two of the plurality of pyramid-shaped structures have different heights from each other.

13. The module of claim 1, wherein at least two of the plurality of pyramid-shaped structures overlap with adjacent structures.

14. The module of claim 1, wherein the optical sheet comprises a depression and protrusion structure, wherein at least individual depressions and protrusions comprise a shape with a planar lateral face and a curved lateral face.

15. The module of claim 1, wherein the optical sheet does not include light diffusion particles therein.

16. The module of claim 1, wherein the diffusion particles comprise one of $TiO_2$ or $SiO_2$.

17. The module of claim 16, wherein the optical sheet comprises a depression and protrusion structure formed on one surface thereof, and the depression and protrusion structure is formed on a side of the optical sheet through which light made incident from the at least one light source unit is emitted from the optical sheet.

18. The module of claim 17, wherein the optical sheet and the diffusion sheet are spaced apart.

19. The module of claim 17, wherein the diffusion sheet is stacked on the optical sheet.

20. The module of claim 17, wherein the at least one light source unit is a plurality of light source units are arranged on the circuit board, and the distance between the circuit board and the diffusion sheet is smaller than or equal to a half of a pitch between the plurality of light source units.

21. A backlight unit comprising:
   a plurality of light source units comprising a light emitting element emitting light when electricity is applied thereto;
   an optical sheet disposed above the plurality of light source units and exhibiting bidirectional transmittance distribution function characteristics comprising a first peak at a radiation angle less than 0° and a second peak at a radiation angle greater than 0°; and
   a diffusion sheet disposed in a path of light transmitted through the optical sheet after having been emitted from the plurality of light source units, and comprising diffusion particles dispersed in a light-transmissive base, wherein the optical sheet comprises a plurality of pyramid-shaped structures, wherein at least one of the plurality of pyramid-shaped structures comprises a plurality of sloped faces which are sloped to a horizontal plane, wherein the plurality of sloped faces have different tilt angles, and the plurality of light source units are arranged on a circuit board, and a distance between the circuit board and the diffusion sheet is smaller than or equal to a half of a pitch between the plurality of light source units.

22. The backlight unit of claim 21, further comprising:
a luminance enhancement sheet disposed in a path of light transmitted through the diffusion sheet.

23. A display apparatus comprising:
a plurality of light source units comprising a light emitting element emitting light when electricity is applied thereto;
an optical sheet disposed above the plurality of light source units and exhibiting bidirectional transmittance distribution function characteristics comprising a first peak at a radiation angle less than 0° and a second peak at a radiation angle greater than 0°;
a diffusion sheet disposed in a path of light transmitted through the optical sheet after having been emitted from the plurality of light source units, and comprising diffusion particles dispersed in a light-transmissive base; and
a display panel disposed at an upper portion of the diffusion sheet,
wherein the optical sheet comprises a plurality of pyramid-shaped structures, wherein at least one of the plurality of pyramid-shaped structures comprises a plurality of sloped faces which are sloped to a horizontal plane, wherein the plurality of sloped faces have different tilt angles, and the plurality of light source units are arranged on a circuit board, and a distance between the circuit board and the diffusion sheet is smaller than or equal to a half of a pitch between the plurality of light source units.

24. A television set comprising the display apparatus of claim 23.

25. An illumination apparatus comprising:
a plurality of light source units comprising a light emitting element emitting light when electricity is applied thereto;
an optical sheet disposed above the plurality of light source units and exhibiting bidirectional transmittance distribution function characteristics comprising a first peak at a radiation angle less than 0° and a second peak at a radiation angle greater than 0°;
a housing which surrounds the plurality of light source units and the optical sheet; and
a diffusion sheet disposed in a path of light transmitted through the optical sheet after being emitted from the plurality of light source units, and comprising diffusion particles dispersed in the interior or a light-transmissive base,
wherein the optical sheet comprises a plurality of pyramid-shaped structures, wherein at least one of the plurality of pyramid-shaped structures comprises a plurality of sloped faces which are sloped to a horizontal plane, wherein the plurality of sloped faces have different tilt angles, and the plurality of light source units are arranged on a circuit board, and a distance between the circuit board and the diffusion sheet is smaller than or equal to half of a pitch between the plurality of light source units.

\* \* \* \* \*